US010179312B2

(12) United States Patent
Elimelech et al.

(10) Patent No.: US 10,179,312 B2
(45) Date of Patent: Jan. 15, 2019

(54) IN SITU FORMATION OF BIOCIDAL METAL NANOPARTICLES ON THIN-FILM COMPOSITE REVERSE OSMOSIS MEMBRANES FOR BIOFOULING MITIGATION

(71) Applicant: Yale University, New Haven, CT (US)

(72) Inventors: Menachem Elimelech, New Haven, CT (US); Moshe Ben-Sasson, Rehovot (IL)

(73) Assignee: Yale University, New Haven, CT (US)

( * ) Notice: Subject to any disclaimer, the term of this patent is extended or adjusted under 35 U.S.C. 154(b) by 0 days.

(21) Appl. No.: 15/317,213

(22) PCT Filed: Jun. 10, 2015

(86) PCT No.: PCT/US2015/035011
§ 371 (c)(1),
(2) Date: Dec. 8, 2016

(87) PCT Pub. No.: WO2015/191662
PCT Pub. Date: Dec. 17, 2015

(65) Prior Publication Data
US 2017/0120198 A1    May 4, 2017

Related U.S. Application Data

(60) Provisional application No. 62/010,824, filed on Jun. 11, 2014.

(51) Int. Cl.
*B01D 67/00*    (2006.01)
*C23C 16/06*    (2006.01)
(Continued)

(52) U.S. Cl.
CPC ........... *B01D 65/08* (2013.01); *B01D 61/025* (2013.01); *B01D 67/0093* (2013.01);
(Continued)

(58) Field of Classification Search
CPC ............ B01D 2323/40; B01D 2325/48; B01D 61/025; B01D 65/08; B01D 67/0093
(Continued)

(56) References Cited

U.S. PATENT DOCUMENTS

2008/0072706 A1\* 3/2008 Lee ..................... B22F 9/24
75/345
2012/0318729 A1\* 12/2012 Yip ..................... B01D 61/002
210/490

FOREIGN PATENT DOCUMENTS

WO       2012166701 A2    12/2012
WO    WO-2012166701 A2 \* 12/2012 ............... C02F 1/44

OTHER PUBLICATIONS

Ben-Sasson, et al., "Surface functionalization of thin-film composite membranes with copper nanoparticles for antimicrobial surface properties", Environ Sci Technol., 48(1):384-393, Jan. 7, 2014.
(Continued)

*Primary Examiner* — Alexander M Weddle
(74) *Attorney, Agent, or Firm* — McCarter & English, LLP; Elizabeth A. Hanley; Wei Song

(57) ABSTRACT

The present invention relates to a method including reacting a solution of a salt of a biocidal metal with an active layer of water purification membrane, discarding the biocidal metal salt solution such that a thin layer of the biocidal metal salt solution remains on the membrane surface, reacting a reducing agent solution with the active layer of the membrane and the thin layer of the biocidal metal salt solution thereby forming a biocidal metal nanoparticle-modified membrane, removing the reducing agent solution, and rinsing the biocidal metal nanoparticle-modified membrane.

15 Claims, 21 Drawing Sheets

(51) Int. Cl.
    *B01D 65/08*     (2006.01)
    *B01D 61/02*     (2006.01)

(52) U.S. Cl.
    CPC .......... *C23C 16/06* (2013.01); *B01D 2323/40* (2013.01); *B01D 2325/48* (2013.01)

(58) Field of Classification Search
    USPC ........................................................ 427/333
    See application file for complete search history.

(56) References Cited

OTHER PUBLICATIONS

Mauter, et al., "Antifouling ultrafiltration membranes via post-fabrication grafting of biocidal nanomaterials", ACS Appl Mater interfaces, 3(8):2861-2868, Aug. 2011.

Bajpai, et al., "In situ formation of silver nanoparticles in poly(methacrylic acid) hydrogel for antibacterial applications", Polymer Engineering & Science, 53(8):1751-1759, Aug. 2013.

* cited by examiner

IN SITU FORMATION OF BIOCIDAL METAL NANOPARTICLES ON THIN-FILM COMPOSITE REVERSE OSMOSIS MEMBRANES FOR BIOFOULING MITIGATION

CROSS REFERENCE TO RELATED APPLICATIONS

This application is a national stage filing under 35 U.S.C. § 371 of International Application No. PCT/US2015/035011, filed Jun. 10, 2015, which claims priority to, and the benefit of, U.S. Provisional Application Ser. No. 62/010,824, filed on Jun. 11, 2014, the entire contents of each of the foregoing applications are incorporated herein by reference.

STATEMENT REGARDING FEDERALLY SPONSORED RESEARCH OR DEVELOPMENT

This invention was made with government support under 1122492 awarded by the National Science Foundation. The government has certain rights in the invention.

BACKGROUND OF THE INVENTION

The unique nature of bacteria, which can thrive even under extreme conditions, poses a major operational challenge in membrane processes.[1,2,3] Bacteria tend to form a cohesive biofilm on membrane surfaces[4], leading to an increase in the hydraulic resistance to permeation flow[5]. In desalination membranes, biofilms also intensify concentration polarization effects, leading to biofilm enhanced osmotic pressure and subsequent decline in product water flux and salt rejection[6]. Despite many past studies on biofouling formation mechanisms and control strategies[7,8], a solution for preventing biofilm formation in membrane systems is still elusive[9]. Therefore, it is of paramount importance to develop improved biofouling control strategies for more sustainable operation of membrane systems for desalination and wastewater reuse.

[1] Baker, J. S., Dudley, L. Y., 1998. Biofouling in membrane systems—a review. Desalination 118 (1-3), 81-89.
[2] Saeed, M. O., Jamaluddin, A. T., Tisan, I. A., Lawrence, D. A., Al-Amri, M. M., Chida, K., 2000. Biofouling in a seawater reverse osmosis plant on the red sea coast, saudi arabia. Desalination 128 (2), 177-190.
[3] Schneider, R. P., Ferreira, L. M., Binder, P., Bejarano, E. M., Goes, K. P., Slongo, E., Machado, C. R., Rosa, G. M. Z., 2005. Dynamics of organic carbon and of bacterial populations in a conventional pretreatment train of a reverse osmosis unit experiencing severe biofouling. Journal of Membrane Science 266 (1-2), 18-29.
[4] Flemming, H. C., Wingender, J., 2010. The biofilm matrix. Nature Reviews Microbiology 8 (9), 623-633.
[5] Herzberg, M., Kang, S., Elimelech, M., 2009. Role of extracellular polymeric substances (eps) in biofouling of reverse osmosis membranes. Environmental Science & Technology 43 (12), 4393-4398.
[6] Herzberg, M., Elimelech, M., 2007. Biofouling of reverse osmosis membranes: Role of biofilm-enhanced osmotic pressure. Journal of Membrane Science 295 (1-2), 11-20.
[7] Mansouri, J., Harrisson, S., Chen, V., 2010. Strategies for controlling biofouling in membrane filtration systems: Challenges and opportunities. Journal of Materials Chemistry 20 (22), 4567-4586.
[8] Matin, A., Khan, Z., Zaidi, S. M. J., Boyce, M. C., 2011. Biofouling in reverse osmosis membranes for seawater desalination: Phenomena and prevention. Desalination 281, 1-16.
[9] Vrouwenvelder, J. S., Kruithof, J. C., Van Loosdrecht, M. C. M., 2010. Integrated approach for biofouling control. Water Science and Technology 62 (11), 2477-2490.

For reverse osmosis (RO) membrane systems, feed waters with high biological activity require extensive pretreatment to lower the potential of biofouling development inside the RO membrane module. Specifically, both physicochemical removal methods and disinfection/oxidation of feed water to inactivate bacteria are commonly applied[10,11]. Physicochemical pretreatment processes significantly reduce the number of bacteria arriving at the RO membrane modules downstream, but they are not capable of removing all bacteria from the feed[12,13,14,15,16]. On the other hand, unlike low pressure membranes (microfiltration and ultrafiltration), thin-film composite polyamide membranes, the "gold standard" membranes for RO, degrade upon exposure to disinfectants and oxidants, such as chlorine[17,18]. This necessitates dechlorination of the feed water prior to contacting the RO membrane modules[19,20]. Other disinfection methods, such as UV, will not have residual activity within the membrane module[21]. Therefore, in the absence of biocidal activity inside the membrane module, bacteria that survive the pretreatment can proliferate and form a biofilm on the membrane surface during the desalination process[22,23].

[10] Lee, J., Oh, B. S., Kim, S., Kim, S. J., Hong, S. K., Kim, I. S., 2010. Fate of bacillus sp and pseudomonas sp isolated from seawater during chlorination and microfiltration as pretreatments of a desalination plant. Journal of Membrane Science 349 (1-2), 208-216.
[11] Prihasto, N., Liu, Q. F., Kim, S. H., 2009. Pre-treatment strategies for seawater desalination by reverse osmosis system. Desalination 249 (1), 308-316.
[12] Ghayeni, S. B. S., Beatson, P. J., Fane, A. J., Schneider, R. P., 1999. Bacterial passage through microfiltration membranes in wastewater applications. Journal of Membrane Science 153 (1), 71-82.
[13] Glueckstern, P., Priel, M., Gelman, E., Perlov, N., 2008. Wastewater desalination in israel. Desalination 222 (1-3), 151-164.
[14] Herzberg, M., Berry, D., Raskin, L., 2010. Impact of microfiltration treatment of secondary wastewater effluent on biofouling of reverse osmosis membranes. Water Research 44 (1), 167-176.
[15] Schneider, R. P., Ferreira, L. M., Binder, P., Bejarano, E. M., Goes, K. P., Slongo, E., Machado, C. R., Rosa, G. M. Z., 2005. Dynamics of organic carbon and of bacterial populations in a conventional pretreatment train of a reverse osmosis unit experiencing severe biofouling. Journal of Membrane Science 266 (1-2), 18-29.
[16] Voutchkov, N., 2010. Considerations for selection of seawater filtration pretreatment system. Desalination 261 (3), 354-364.
[17] Glater, J., Hong, S. K., Elimelech, M., 1994. The search for a chlorine-resistant reverse-osmosis membrane. Desalination 95 (3), 325-345.
[20] Shemer, H., Semiat, R., 2011. Impact of halogen based disinfectants in seawater on polyamide ro membranes. Desalination 273 (1), 179-183.
[19] Prihasto, N., Liu, Q. F., Kim, S. H., 2009. Pre-treatment strategies for seawater desalination by reverse osmosis system. Desalination 249 (1), 308-316.
[20] Schneider, R. P., Ferreira, L. M., Binder, P., Bejarano, E. M., Goes, K. P., Slongo, E., Machado, C. R., Rosa, G. M. Z., 2005. Dynamics of organic carbon and of bacterial populations in a conventional pretreatment train of a reverse osmosis unit experiencing severe biofouling. Journal of Membrane Science 266 (1-2), 18-29.
[21] Kim, D., Jung, S., Sohn, J., Kim, H., Lee, S., 2009. Biocide application for controlling biofouling of swro membranes—an overview. Desalination 238 (1-3), 43-52.
[22] Flemming, H. C., Schaule, G., Griebe, T., Schmitt, J., Tamachkiarowa, A., 1997. Biofouling—the achilles heel of membrane processes. Desalination 113 (2-3), 215-225.
[23] Saeed, M. O., Jamaluddin, A. T., Tisan, I. A., Lawrence, D. A., Al-Amri, M. M., Chida, K., 2000. Biofouling in a seawater reverse osmosis plant on the red sea coast, saudi arabia. Desalination 128 (2), 177-190.

Bacteria in biofilm are much more resistant to cleaning and biocides compared to planktonic bacteria[24], underscoring the importance of preventing biofilm formation on the membrane. For mitigating biofilm formation, RO membrane manufacturers recommend intensive chemical cleaning every few months when the operational water flux decline to below 10% of the initial flux or when the required applied hydraulic pressure to maintain a constant product water flux increases by 15%[25,26]. Also non-oxidizing biocides, such as 2,2-dibromo-3-nitrilopropionamide (DBNPA), can be added to the feed during operation to inactivate bacteria within the module[27,28]. However, efficient use of these biocides requires high concentrations and relatively long exposure time (1-4 h), which increases cost and produces large waste streams. Therefore, there is a critical need to develop biofouling control strategies that lower biofouling potential inside the RO module by continuous inactivation of bacteria and by suppression of biofilm formation during filtration[29].

[24] Davies, D., 2003. Understanding biofilm resistance to antibacterial agents. Nature Reviews Drug Discovery 2 (2), 114-122.
[25] Hydranautics, 2011. Foulants and cleaning procedures for composite polyamide ro membrane elements. Technical Service Bulletin, Web site: http://www.membranes.com/docs/tsb/tsb107.pdf.
[26] Vrouwenvelder, J. S., Kruithof, J. C., Van Loosdrecht, M. C. M., 2010. Integrated approach for biofouling control. Water Science and Technology 62 (11), 2477-2490.
[27] Dow, F. M., Water chemistry and pretreatment: Biofouling prevention of filmtec elements with dbnpa. Tech Manual Excerpt, Web site: http://msds-search.dow.com/PublishedLiteratureDOWCOM/dh_015a/0901b8038015acc8038014.pdf?filepath=liquidseps/pdfs/noreg/8038609-8002036.pdf&fromPage=GetDoc.
[28] Hydranautics, 2013. Biocides for disinfection and storage of hydranautics membrane elements. Technical Service Bulletin, Web site: http://www.membranes.com/docs/tsb/TSB110.pdf.
[29] Saeed, M. O., Jamaluddin, A. T., Tisan, I. A., Lawrence, D. A., Al-Amri, M. M., Chida, K., 2000. Biofouling in a seawater reverse osmosis plant on the red sea coast, saudi arabia. Desalination 128 (2), 177-190.

In recent years, several studies demonstrated the potential to use metal nanoparticles (Me-NPs), such as silver nanoparticles (Ag-NPs)[30,31,32,33], copper nanoparticles (Cu-NPs)[34,35], zinc nanoparticles (Zn-NPs)[36], and selenium nanoparticles (Se-NPs)[37,38] as biocides in membrane separation processes. These metals exhibits strong antibacterial activity against numerous types of bacteria[39], but their usage as biocide in membrane processes is mainly limited by the relatively high cost[40]. Addition of Me-NPs directly into the feed will consume large amounts of metal and therefore will not be economical. Localized loading of small amount of the metals in the vicinity of the membrane surface, where biofilms develop, is more viable for protecting the membrane from biofouling. Therefore, while the potential of different Me-NPs to effectively mitigate biofouling is well established in the literature, the loading method of Me-NPs on the membrane is one of the main hurdles that must be overcome.

[30] Dror-Ehre, A., Adin, A., Markovich, G., Mamane, H., 2010. Control of biofilm formation in water using molecularly capped silver nanoparticles. Water Research 44 (8), 2601-2609.
[31] Liu, Y. L., Rosenfield, E., Hu, M., Mi, B. X., 2013. Direct observation of bacterial deposition on and detachment from nanocomposite membranes embedded with silver nanoparticles. Water Research 47 (9), 2949-2958.
[32] Mauter, M. S., Wang, Y., Okemgbo, K. C., Osuji, C. O., Giannelis, E. P., Elimelech, M., 2011. Antifouling ultrafiltration membranes via post-fabrication grafting of biocidal nanomaterials. Acs Applied Materials & Interfaces 3 (8), 2861-2868.
[33] Zodrow, K., Brunet, L., Mahendra, S., Li, D., Zhang, A., Li, Q. L., Alvarez, P. J. J., 2009. Polysulfone ultrafiltration membranes impregnated with silver nanoparticles show improved biofouling resistance and virus removal. Water Research 43 (3), 715-723.
[34] Ben-Sasson, M., Zodrow, K. R., Gengeng Q., Kang, Y., Giannelis, E. P., Elimelech, M., 2013. Surface functionalization of thin-film composite membranes with copper nanoparticles for antibacterial surface properties. Environmental Science and Technology 48 (1), 384-393.
[35] Akar, N., Asar, B., Dizge N., Koyuncu, I., 2013. Investigation of characterization and biofouling properties of PES membrane containing selenium and copper nanoparticles. Journal of Membrane Science 437, 216-226.
[36] Ronen, A., Semiat, R., Dosoretz, C. G., 2013. Impact of ZnO embedded feed spacer on biofilm development in membrane systems. Water Research 47, 6628-6638.
[37] Akar, N., Asar, B., Dizge N., Koyuncu, I., 2013. Investigation of characterization and biofouling properties of PES membrane containing selenium and copper nanoparticles. Journal of Membrane Science 437, 216-226.
[38] Low, D., Hamood, A., Reid, T., Mosley, T., Tran, P., Song, L., Morse, A., 2011. Attachment of selenium to a reverse osmosis membrane to inhibit biofilm formation of S. aureus. Journal of Membrane Science 378, 171-178.
[39] Harrison, J. J., Ceri, H., Stremick, C. A., Turner, R. J., 2004. Biofilm susceptibility to metal toxicity. Environmental Microbiology 6 (12), 1220-1227.
[40] USGS, 2012. Metal prices in the united states through 2010. Scientific Investigations Report 2012-5188, Web site: http://pubs.usgs.gov/sir/2012/5188/sir2012-5188.pdf.

When considering Me-NP loading procedure on the membrane, the aqueous dissolution of Me-NPs over time[41,42,43], which can be exacerbated by the routine chemical cleaning, must be considered. Therefore, a suggested loading method of Me-NPs on the membrane must demonstrate also the ability to repeatedly recharge the Me-NPs on the membrane. This recharging procedure must be done on site, without disassembling the membrane module. Also, the Me-NP loading method must be economical in terms of chemical usage and time.

[41] Kent, R. D., Vikesland, P. J., 2012. Controlled evaluation of silver nanoparticle dissolution using atomic force microscopy. Environmental Science & Technology 46 (13), 6977-6984.
[42] Kittler, S., Greulich, C., Diendorf, J., Koller, M., Epple, M., 2010. Toxicity of silver nanoparticles increases during storage because of slow dissolution under release of silver ions. Chemistry of Materials 22 (16), 4548-4554.
[43] Liu, J. Y., Sonshine, D. A., Shervani, S., Hurt, R. H., 2010. Controlled release of biologically active silver from nanosilver surfaces. Acs Nano 4 (11), 6903-6913.

Embedding Me-NPs or metal salts such as silver, copper, zinc, and selenium, in the RO polyamide layer during membrane fabrication[44,45] will have low efficiency since only a small fraction of the Me-NPs will be exposed on the membrane surface. Furthermore, Me-NPs may only be embedded inside the membrane during membrane fabrication, and there is no opportunity for Me-NP recharge after dissolution and depletion. Binding of previously prepared Me-NPs on the membrane surface[46] is a more plausible approach; however, this method will involve Me-NP synthesis and the use of a capping chemical agent, which increases cost. In addition, only a fraction of the synthesized nanoparticles in solution will eventually bind to the membrane surface. The principle suggested by Yang et al., of simultaneous fabrication and loading of Ag-NPs on the membrane by chemical reduction (in situ formation), while appearing to be a more favorable route for Ag-NP loading method on TFC-RO membrane[47], is in fact not desirable because the Ag-NPs are bound to a spacer in Yang et al. and are not bound to the membrane. Furthermore, the use of several chemicals at relatively high concentrations (10 vol % ammonium-hydroxide, 0.4 M formaldehyde, 0.02 M silver nitrate), the use of ethanol as the reducing solution, and the relatively long reaction time (more than 1 h) of Yang et al. is also not desirable. For other metals such as copper, zinc, and selenium, an efficient procedure of simultaneous formation and binding of these Me-NPs on the membrane was not demonstrated yet.

[44] Lee, S. Y., Kim, H. J., Patel, R., Im, S. J., Kim, J. H., Min, B. R., 2007. Silver nanoparticles immobilized on thin film composite polyamide membrane: Characterization, nanofiltration, antifouling properties. Polymers for Advanced Technologies 18 (7), 562-568.
[45] Rana, D., Kim, Y., Matsuura, T., Arafat, H. A., 2011. Development of antifouling thin-film-composite membranes for seawater desalination. Journal of Membrane Science 367 (1-2), 110-118.
[46] Yin, J., Yang, Y., Hu, Z. Q., Deng, B. L., 2013. Attachment of silver nanoparticles (agnps) onto thin-film composite (tfc) membranes through covalent bonding to reduce membrane biofouling. Journal of Membrane Science 441, 73-82.
[47] Yang, H. L., Lin, J. C. T., Huang, C., 2009. Application of nanosilver surface modification to ro membrane and spacer for mitigating biofouling in seawater desalination. Water Research 43 (15), 3777-3786.

The potential to incorporate metal nanoparticles, for example silver nanoparticles (Ag-NPs) and copper nanoparticles (Cu-NPs) discussed above, as biocides in membranes for water purification has gained much interest in recent years. However, a viable strategy for loading biocidal metal nanoparticles on water purification membranes remains challenging.

BRIEF SUMMARY OF THE INVENTION

The present invention provides a novel, facile procedure for loading biocidal metal nanoparticles on thin-film composite (TFC) reverse osmosis membranes. As such, the present invention generally relates to a method for the in situ formation of biocidal metal nanoparticles on a water purification membrane. More specifically, the method includes reacting a solution of a salt of a biocidal metal with an active layer of the membrane, discarding the biocidal metal salt solution such that a thin layer of the biocidal metal salt solution remains on the membrane surface, reacting a reducing agent solution with the active layer of the membrane and the thin layer of the biocidal metal salt solution thereby forming a biocidal metal nanoparticle-modified membrane, removing the reducing agent solution, and rinsing the biocidal metal nanoparticle-modified membrane.

With respect to in situ formation of Ag-NPs on water purification membranes as one example of the present invention, reaction of silver salt with a reducing agent on the membrane surface resulted in uniform coverage of Ag-NPs, irreversibly bound to the membrane, as confirmed by XPS, TEM, and SEM analyses. Salt selectivity of the membrane as well its surface roughness, hydrophilicity, and zeta potential were not impacted by Ag-NP functionalization, while only a slight reduction (up to 17%) in water permeability was observed. The formed Ag-NPs imparted strong antibacterial activity to the membrane, leading to reduction of more than 75% in the number of attached live bacteria to the membrane for three model bacteria strains. In addition, confocal microscopy analyses revealed that Ag-NPs significantly suppressed biofilm formation, with 41% reduction in total biovolume and significant reduction in EPS, dead, and live bacteria on the functionalized membrane.

With respect to in situ formation of Cu-NPs on water purification membranes as another example of the present invention, successful loading of Cu-NPs on the membrane was demonstrated by SEM and XPS. The in situ formation of Cu-NPs had inconspicuous impact on the membrane intrinsic transport properties and also on the membrane surface properties. The in situ Cu-NP modified membrane demonstrated strong statistical significant antibacterial activity that led to 90% reduction in the number of live bacteria that were attached to the membrane surface after 2 hours of incubation, as compared to non-modified membrane.

The simplicity of the above-noted methods, the short reaction times, the ability to load the biocidal metal nanoparticles on site, and the strong imparted antibacterial activity highlight the potential industrial applications of such methods.

DETAILED DESCRIPTION OF THE INVENTION

The present invention relates to a method for the in situ formation of biocidal metal nanoparticles on a water purification membrane. More specifically, the method includes reacting a solution of a salt of a biocidal metal with an active layer of the membrane, discarding the biocidal metal salt solution such that a thin layer of the biocidal metal salt solution remains on the membrane surface, reacting a reducing agent solution with the active layer of the membrane and the thin layer of the biocidal metal salt solution thereby forming a biocidal metal nanoparticle-modified membrane, removing the reducing agent solution, and rinsing the biocidal metal nanoparticle-modified membrane. The method is most preferably performed at ambient conditions.

Any biocidal metal can be used in the method of the present invention, including, but not limited to, copper, gold, silver, selenium and zinc. Any salt of a biocidal metal can be used in the method of the present invention, including, but not limited to, nitrates, sulfates, chlorates, chromates, carbonates and oxides. Any reducing agent can be used in the method of the present invention, including, but not limited to, borohydrides, sulfites, phosphites, oxalic acid, formic acid, hydrazine and ascorbic acid. The rinsing solution can be, for example, deionized water.

The method of the present invention will be described in greater detail below with respect to exemplary embodiments drawn toward the in situ formation of nanoparticles on membranes using particular biocidal metals, however, the scope of the present invention is not limited thereto—use of other biocidal metals in the method of the present invention is encompassed herein.

A. Silver Nanoparticles (Ag-NPs)

i) In Situ Formation of Ag-NPs on TFC RO Membrane

Dried sheets of seawater reverse osmosis membrane (Dow Filmtec SW30XLE) were received from OctoChem, Inc. The dried membranes coupons were wetted through immersion in 20% isopropanol and 80% DI water for 20 min. Then, the membranes were rinsed and soaked three times in DI water for 24 h and stored at 4° C. until use.

Figure 1:
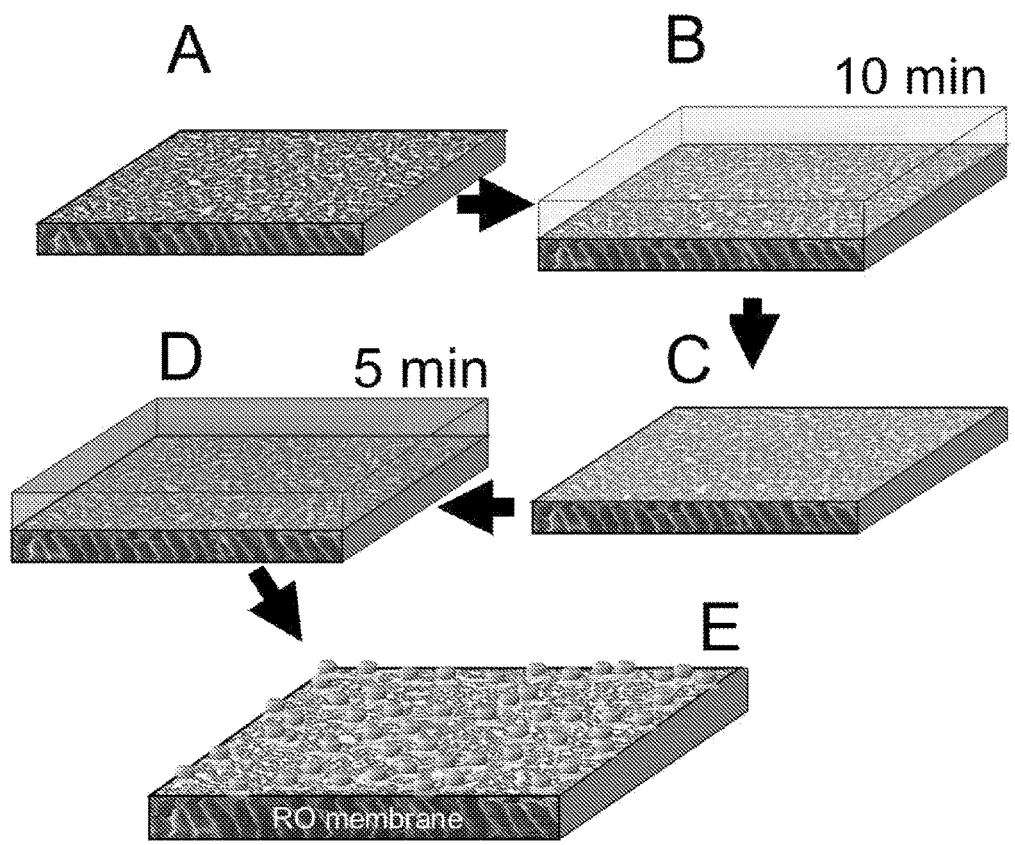
FIG. 1 is a schematic diagram of in situ formation of Ag-NPs on a TFC RO membrane: pristine RO membrane (A) is covered with $AgNO_3$ solution (yellow; 1-5 mM) for 10 minutes (B), then, the $AgNO_3$ solution is discarded leaving a thin layer of the $AgNO_3$ solution on the surface (C), next, the membrane is recoated with $NaBH_4$ solution (1-5 mM) for 5 minutes (D) to form Ag-NPs that uniformly cover the membrane surface (E).

In situ formation of Ag-NPs on the RO membrane was carried out in the following stages. The membrane was placed in between a glass plate and rubber frame (inner hole size: 7.5 cm×12 cm) designed to hold the solutions on the active layer side of the membrane. 10 mL of $AgNO_3$ solution (1-5 mM) was reacted with the isolated active layer for 10 min (FIG. 1B). Subsequently, the $AgNO_3$ solution was discarded, leaving only a thin layer (for instance, 300 μm or less, or 200 μm or less, or 100 μm or less) of $AgNO_3$ solution on the membrane surface (FIG. 1C). Then, the membrane active layer was reacted with a $NaBH_4$ (1-5 Mm) solution for 5 min (FIG. 1D), forming silver nanoparticles. After formation of Ag-NPs, the $NaBH_4$ solution was removed from the membrane (FIG. 1E), and the prepared in situ Ag-NPs modified membrane was rinsed for ~10 s with DI water. All in situ reactions were done at ambient conditions.

The concentration of the above-noted $AgNO_3$ solution can be from 0.1 mM to 100 mM, preferably from 0.1 mM to 50 mM, more preferably from 0.1 mM to 20 mM, even more preferably from 1 mM to 10 mM, and most preferably from 1 mM to 5 mM.

The concentration of the above-noted $NaBH_4$ solution can be from 0.1 mM to 200 mM, preferably from 0.1 mM to 100 mM, more preferably from 0.1 mM to 50 mM, even more preferably from 1 mM to 10 mM, and most preferably from 1 mM to 5 mM.

The above-noted reaction time for reacting the $AgNO_3$ solution with the isolated active layer can be from 0.5 minutes to 30 minutes, preferably from 1 minute to 25 minutes, more preferably from 2 minutes to 20 minutes, even more preferably from 5 minutes to 15 minutes, and most preferably about 10 minutes.

The above-noted reaction time for reacting the membrane active layer with the NaBH$_4$ solution can be from 0.5 minutes to 60 minutes, preferably from 0.5 minutes to 30 minutes, more preferably from 1 minute to 20 minutes, even more preferably from 1 minute to 10 minutes, and most preferably about 5 minutes.

The above-noted rinsing time for rinsing the prepared in situ Ag-NPs modified membrane can be from 1 second to 10 minutes, preferably from 1 second to 5 minutes, more preferably from 1 second to 1 minute, even more preferably from 1 second to 30 seconds, and most preferably about 10 seconds.

Scanning and transmission electron microscopy were used to characterize the in situ Ag-NPs modified and the pristine membranes. For SEM, the membrane was dried and sputter-coated (Denton Vacuum, DESK V) with 15 nm chrome prior to analysis (Hitachi Ultra-High-Resolution Analytical Field Emission Scanning Electron Microscope, FE-SEM, SU-70). For transmission electron microscopy (TEM) cross-section image, the in situ Ag-NPs modified membrane sample was fixed in an epoxy resin and cut using a Leica UC7 cryomicrotome into 100 nm slices at −60° C. Then, the sample was loaded onto carbon coated copper microgrids via dry pickup. Bright-field TEM images were obtained by a FEI Tecnai T12 Spirit Twin TEM/STEM operated at 120 kV. X-ray photoelectron spectroscopy (XPS; Surface Science Instruments model SSX-100—SPECS) measurements for surface elemental analysis were done with monochromatized Al-Kα X-ray source (hv=1486.6 eV).

ii) Quantifying of Silver Loading

Ag-NPs modified membrane coupons (3.8 cm$^2$) were placed in glass vials containing 10 mL DI water with 0.1 mL of 70% HNO$_3$. The vial with the membrane was agitated for one day to dissolve the metals from the membrane. Subsequently, the dissolved silver concentration in the vial solution was quantified with inductive coupled plasma mass-spectrophotometer (ICP-MS, ELAN DRC-e ICP Mass Spectrometer, Perkin Elmer).

In order to examine the residual silver loading on the membrane after dissolution, 3.8 cm$^2$ coupons of in situ Ag-NPs modified membranes were placed in glass vials filled with 10 mL of 5 mM NaHCO$_3$ solution (pH 8.3; without HNO$_3$). The vial with the membrane was agitated. At predetermined time intervals, the solution was removed, and the empty glass vial containing the membrane was refilled with 10 mL DI water with 0.1 mL of 70% HNO$_3$ to promote dissolution of the residual silver from the membrane. Subsequently, the dissolved silver concentration in the solution was quantified with ICP-MS.

iii) Membrane Characterization

The transport properties of the membrane were examined in a standard laboratory RO filtration system[48]. Two measurements were taken for each type of membrane. The membrane (area of 20.02 cm$^2$) was compacted overnight under 31 bar (450 psi), and then the pressure was reduced to 27.6 bar (400 psi) to determine the pure water permeability measurement, A. The salt rejection was measured at 400 psi with 50 mM NaCl. The salt permeability coefficient, B, was calculated from the water fluxes and salt rejections according to the method described previously[49]. All the filtration experiments were carried out at 25.0±0.5° C. with a cross-flow velocity of 21.4 cm/s.

[48] Hoek, E. M. V., Kim, A. S., Elimelech, M., 2002. Influence of crossflow membrane filter geometry and shear rate on colloidal fouling in reverse osmosis and nanofiltration separations. Environmental Engineering Science 19 (6), 357-372.

[49] Yip, N. Y., Tiraferri, A., Phillip, W. A., Schiffman, J. D., Elimelech, M., 2010. High performance thin-film composite forward osmosis membrane. Environmental Science & Technology 44 (10), 3812-3818.

Surface contact angle (VCA Video Contact Angle System; AST Products, Billerica, Mass.) measurements were performed to evaluate the membrane surface hydrophilicity. To account for variations in the measurements, eight measurements were performed on each of two samples. The zeta potential of the membranes was calculated from streaming potential measurements performed with an electro kinetic analyzer (EKA, Brookhaven Instruments, Holtsville, N.Y.) following procedures reported previously[50]. Prior to the measurements, the membrane samples were equilibrated with the testing solution (1 mM KCl) for at least 45 min. Measurements were performed at room temperature (23° C.) at pH 4-9, adjusted with aliquots of 1 M HCl and KOH. For each membrane type, two separate samples were characterized to account for the system variation.

[50] Walker, S. L., Bhattacharjee, S., Hoek, E. M. V., Elimelech, M., 2002. A novel asymmetric clamping cell for measuring streaming potential of flat surfaces. Langmuir 18 (6), 2193-2198.

Surface roughness was determined using atomic force microscopy (AFM, Bruker, Digital Instruments, Santa Barbara, Calif.) in tapping mode with a silicon probe. The probe had a spring constant of 40 N/m, a resonance frequency of 300 kHz, a tip radius of 8±4 nm, and a cantilever length of 125±10 μm. Micrographs were captured from three different spots with area of 15 μm×15 μm on each membrane sample. Three samples of each membrane type (pristine and modified) were characterized to calculate average roughness.

iv) Antimicrobial Activity of Ag-NP Functionalized Membranes

The antimicrobial properties of the membrane were assessed using three model bacteria: *E. coli, P. aeruginosa*, and *S. aureus*. An overnight culture of bacteria (1 mL) grown in LB was diluted in 24 mL fresh LB broth and grown for 2-3 hours to exponential phase. Viable cell attachment experiments were carried out to quantify the number of live bacteria attached to pristine and in situ modified (2 mM AgNO$_3$: 2 mM NaBH$_4$) membranes. The bacteria culture was centrifuged for 1 minute at 5,000 rpm (Eppendorf 5415D) in 1 mL centrifuge tubes, and resuspended in isotonic saline solution (0.15 M NaCl, 20 mM NaHCO$_3$, pH 8.2) to an initial OD$_{600}$ of 0.15±0.09. Circular membrane coupons (3.8 cm$^2$) were placed in sterile plastic tubes with the bacteria in an isotonic (saline) solution. Only the membrane polyamide active layer was exposed to the bacteria suspension during incubation. The tubes were incubated for 5 h (37° C.). After incubation, the membranes were rinsed gently with DI water to remove unattached bacteria. Membrane coupons were then bath-sonicated for 7 min in 10 mL of isotonic solution to remove the attached bacteria. The suspension was diluted, plated on LB agar plates, incubated overnight following which bacteria colonies were counted. To evaluate the effect of different silver loadings on viable bacteria attachment, a similar procedure was conducted with only 2 hour incubation with *E. coli*, using 1:1, 2:2, and 5:5 (AgNO$_3$:NaBH$_4$ in mM) in situ Ag-NPs modified membranes.

Membrane samples were also viewed with SEM (Hitachi Ultra-High-Resolution Analytical Field Emission Scanning Electron Microscope) after contact with bacteria to observe changes in cell morphology. After 5 h incubation, the membranes were gently rinsed, and the bacteria were fixed with 5% glutaraldehyde at −20° C. overnight. The fixed membranes and bacteria were thawed at room temperature and the remaining liquid was removed. Membranes were dried and coated with 15 nm chrome (Denton Vacuum Desk V) before SEM imaging.

v) Impact of In Situ Formed Ag-NPs on Biofilm Development The effect of in situ formed Ag-NPs on biofilm development was evaluated in two custom-designed flow cells[51] equipped with a pristine or modified membrane coupon (7 cm$^2$). *P. aeruginosa* was cultivated in an artificial sterile wastewater media enriched with 0.5% LB broth as a carbon source. Fresh wastewater was prepared by supplementing deionized water (Nano Pure II, Barnstead, Dubuque, Iowa) with 1.2 mM sodium citrate, 0.8 mM $NH_4Cl$, 0.2 mM $KH_2PO_4$, 0.2 mM $CaCl_2 \cdot H_2O$, 0.5 mM $NaHCO_3$, 8.0 mM NaCl, and 0.15 mM $MgSO_4 \cdot 7H_2O$ (modified from Bar-zeev and Elimelech (2014)[52]).

[51] Bar-Zeev, E., Berman-Frank, I., Girshevitz, O., Berman, T., 2012. Revised paradigm of aquatic biofilm formation facilitated by microgel transparent exopolymer particles. Proceedings of the National Academy of Sciences of the United States of America 109 (23), 9119-9124.

[52] Bar-zeev, E., Elimelech, M., 2014. Reverse osmosis biofilm dispersal by osmotic back-flushing: Cleaning via substratum perforation. Enviromental science and technology letters.

Initially, bacteria were inoculated for four hours by passing a synthetic wastewater solution with a concentrated (10$^9$ cells mL$^{-1}$) bacteria culture at flow rate of ~0.6 mL min$^{-1}$ through both flow cells. During the experiment, the flow-cell was held vertically to avoid attachment of bacteria or particles by gravity to the glass slide. After 4 h, the circulated solution was changed to a sterilized synthetic wastewater without bacteria for promoting biofilm growth of the bacteria that were attached in the first stage. The second stage of biofilm growth lasted 24 h and during this stage the flow rate was maintained at ~2 mL min$^{-1}$. The temperature was kept at 25° C. throughout the experiment.

At the end of the run, two 1 cm$^2$ sub-samples were cut from the membrane coupon and placed in separate petri dishes with 3 mL sterile wastewater. Samples were rinsed three times with sterile wastewater to remove loosely adhered bacteria. After rinsing, the biofilm was stained with SYTO® 9 and propidium iodide (PI) according to reagent manual (LIVE/DEAD® BacLight™, Invitrogen, USA) to identify live and dead cells (green and red, respectively). Concurrently, samples were stained with 50 μM concanavalin A (Con A, Alexa Flour® 633, Invitrogen, USA) to determine biofilm EPS (blue). All samples were stained for at least 20 min in the dark. Unbound stain was removed by rinsing the samples three times with sterile WW.

Confocal images were captured using a CLSM (Zeiss LSM 510, Carl Zeiss, Inc.) equipped with a Plan-Apochromat 20×/0.8 numerical aperture objective. A minimum of six Z stack random fields (635 μm$^2$) were collected for each sample, with a slice thickness of 2.14 μm, using ZEN® (Carl Zeiss, Inc.) to obtain representative areas of biofilm. SYTO® 9, PI, and Con A were excited with three sets of lasers: 488 nm argon, 561 nm diode-pumped solid state, and 633 nm helium-neon laser, respectively. Image analysis was performed using Auto-PHLIP-ML (http://sourceforge.net/projects/phlip/), Image J software (http://rsbweb.nih.gov), and MATLAB® (The Mathworks™, Inc.). Thickness and biovolume were determined for the EPS polysaccharides (Con A staining), live, and dead bacterial cells (SYTO® 9 and PI staining) components of the biofilm for all samples. Total biovolume was calculated by summing the live, dead, and EPS biovolumes.

vi) Chemicals

Calcium chloride dihydrate ($CaCl_2 \cdot 2H_2O$), copper sulfate ($CuSO_4$), ethylenediaminetetraacetic acid ($C_{10}H_{16}N_2O_8$; EDTA), nitric acid ($HNO_3$), potassium chloride (KCl), silver nitrate ($AgNO_3$) and sodium dodecyl sulfate ($C_{12}H_{25}NaO_4S$; SDS) were purchased from Sigma Aldrich (St. Louis, Mo.). Ammonium chloride ($NH_4Cl$), hydrochloric acid (HCl), magnesium chloride hexahydrate ($MgSO_4 \cdot 6H_2O$), potassium phosphate ($KH_2PO_4$), sodium chloride (NaCl), sodium citrate dihydrate (HOC(COONa)($CH_2COONa)_2 \cdot 2H_2O$), sodium hydroxide (NaOH), and 2-propanol (isopropyl alchohol, $CH_3CHOHCH_3$) were purchased from J. T. Baker (Phillipsburg, N.J.). Potassium bicarbonate ($KHCO_3$), sodium bicarbonate ($NaHCO_3$), and sodium borohydride ($NaBH_4$) were obtained from Fisher Scientific (Fair Lawn, N.J.). Potassium hydroxide (KOH) was purchased from Aventor Performance Materials (Center Valley, Pa.) and ethanol from Decon Laboratories, Inc. (King of Prussia, Pa.). Bacto agar and Luria-Bertani (LB) broth were received from BD Biosciences (Sparks, Md.) and American Bioanalytical (Natick, Mass.). Unless specified, all the discussed solutions were prepared in deionized (DI) water treated by Milli-Q ultrapure water purification system (Millipore, Billerica, Mass.).

vii) Model Bacteria Strains

Kanamycin resistant *Escherichia coli* (*E. coli*) BW26437 was received from the Yale *Coli* Genetic Stock Center (New Haven, Conn.). *Pseudomonas aeruginosa* (*P. aeruginosa*) ATCC 27853 was obtained from the American Type Culture Collection, and *Staphylococcus aureus* (*S. aureus*) 8325 was kindly provided by Dr. Naomi Balaban. Cultures were maintained on LB agar plates and grown in LB media prior to experiments. LB agar plates for *E. coli* included 25 mg/L kanamycin sulfate (American Bioanalytical).

viii) Results (a) In Situ Formation of Ag-NPs on the Membrane Surface

The current in situ formation method requires only two chemicals for functionalizing RO membrane with Ag-NPs: silver nitrate and reducing agent. DI water, which was used as the solvent for the in situ formation procedure, is available in RO plants. Several advantages led to the selection of sodium borohydride ($NaHB_4$) as the reducing agent. $NaBH_4$ is a common reducing agent used in industrial scales for bleaching of wood pulp[53]. The strong reactivity of $NaHB_4$ leads to rapid metal reduction on the membrane. In addition, under the conditions used, $NaBH_4$ does not reduce carboxylic or amides[54] which are constituents of the polyamide selective layer of TFC-RO membranes. Therefore, reduction by $NaBH_4$ is expected to have minimal impact on the RO membrane salt selectivity and water permeability.

[53] Gulsoy, S. K., Eroglu, H., 2011. Influence of sodium borohydride on kraft pulping of eur pean black pine as a digester additive. Industrial & Engineering Chemistry Research 50 (4), 2441-2444.

[54] Periasamy, M., Thirumalaikumar, P., 2000. Methods of enhancement of reactivity and selectivity of sodium borohydride for applications in organic synthesis. Journal of Organometallic Chemistry 609 (1-2), 137-151.

The initial stage of the in situ formation procedure (FIG. 1) included contact of dilute silver salt solution ($AgNO_3$) with the membrane active layer. During this stage, the hydrolyzed silver ions diffused toward the membrane surface. It is likely that the negatively charged carboxylic groups found on the surface of TFC-RO membranes[55] form electrostatic pairs with silver ions and contribute to Ag-NP nucleation during the reduction stage[56,57]. The majority of the $AgNO_3$ solution was removed (but could be reused), leaving only a residual thin film of solution covering the membrane active layer. The following reaction of the membrane surface with dilute $NaBH_4$ solution led to immediate reduction of the free silver ions found in the residual thin film and to silver precipitation on the membrane surface, according to[58]:

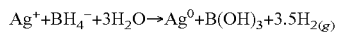

$Ag^+ + BH_4^- + 3H_2O \rightarrow Ag^0 + B(OH)_3 + 3.5H_{2(g)}$

Three types of solutions were initially examined during the in situ formation procedure: 1:1, 2:2, and 5:5 which refer to the concentrations of $AgNO_3$:$NaHB_4$ in mM.

[55] Tiraferri, A., Elimelech, M., 2012. Direct quantification of negatively charged functional groups on membrane surfaces. Journal of Membrane Science 389, 499-508.
[56] Joly, S., Kane, R., Radzilowski, L., Wang, T., Wu, A., Cohen, R. E., Thomas, E. L., Rubner, M. F., 2000. Multilayer nanoreactors for metallic and semiconducting particles. Langmuir 16 (3), 1354-1359.
[57] Li, Z., Lee, D., Sheng, X. X., Cohen, R. E., Rubner, M. F., 2006. Two-level antibacterial coating with both release-killing and contact-killing capabilities. Langmuir 22 (24), 9820-9823.
[58] Song, K. C., Lee, S. M., Park, T. S., Lee, B. S., 2009. Preparation of colloidal silver nanoparticles by chemical reduction method. Korean Journal of Chemical Engineering 26 (1), 153-155.

Figure 2:
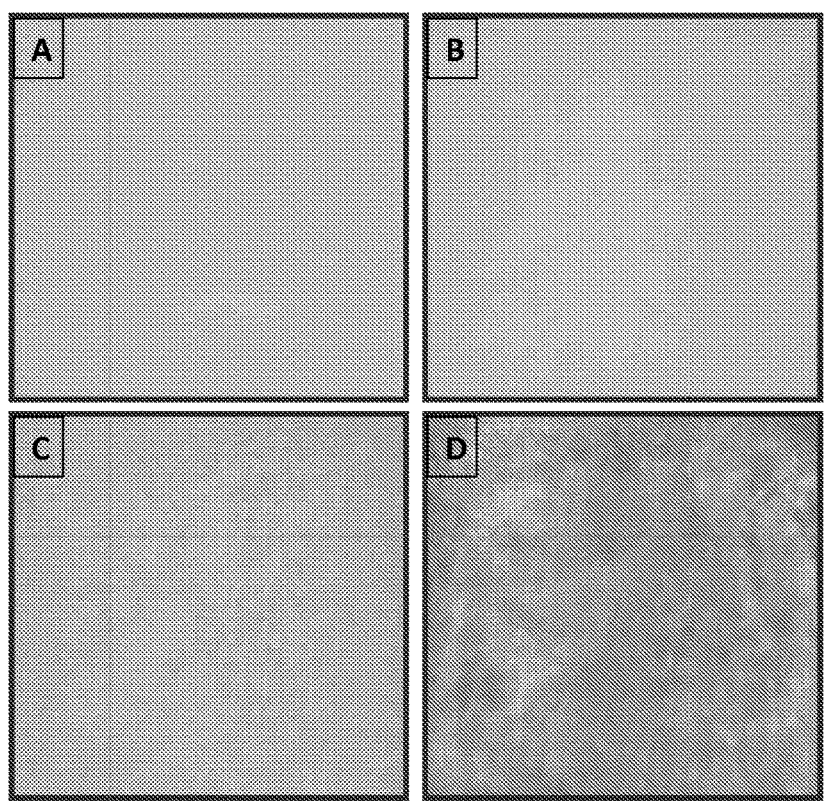
FIG. 2 illustrates the membrane surface color after in situ formation of Ag-NPs: pristine (A) and in situ Ag-NPs modified membranes using concentrations of 1:1 (B), 2:2 (C) and 5:5 (D) $AgNO_3$:$NaBH_4$ (mM), respectively.
Figure 3:
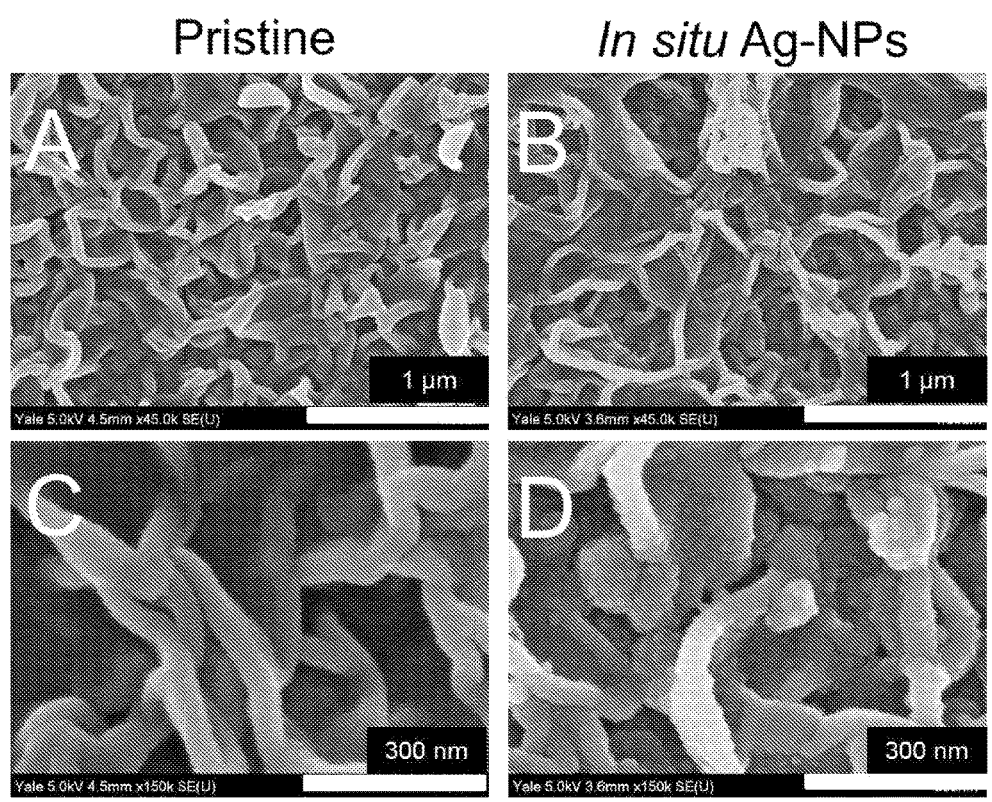
FIG. 3 is SEM micrographs of (A, C) pristine and (B, D) in situ Ag-NP modified active layer of TFC membrane at different magnifications as indicated (solutions of 5 mM $AgNO_3$ and 5 mM $NaBH_4$ (5:5) were used during the in situ formation reaction).
Figure 4:
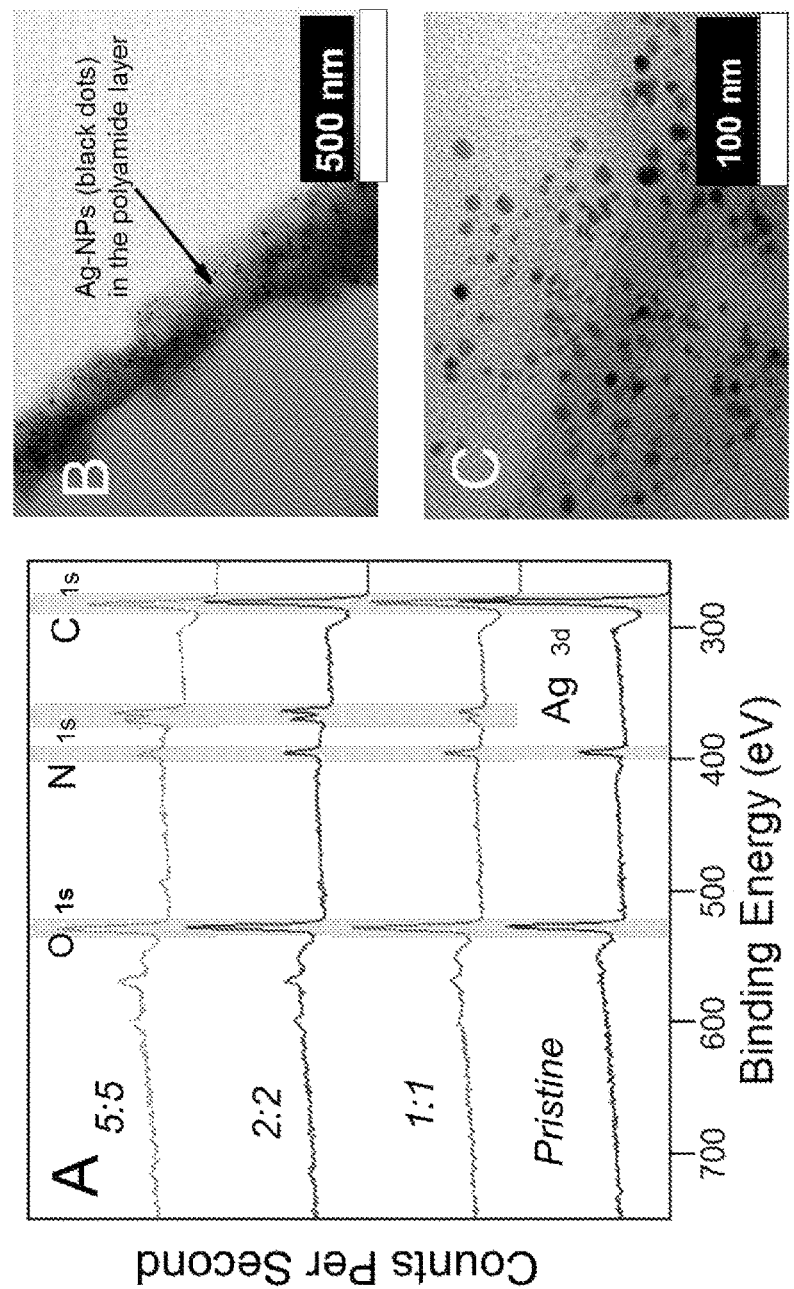
FIG. 4(A) is an XPS spectra of pristine (red) and functionalized TFC membrane with in situ formed Ag-NPs with different concentrations of Ag and $BH_4$ (the curves of 5:5 (blue), 2:2 (pink) and 1:1 (green) represent membranes that were in situ modified with different Ag:$BH_4$ solution concentrations (in mM); the peaks at 365 eV are related to the presence of silver).
FIGS. 4(B) and 4(C) are lower and higher resolution, respectively, of TEM micrographs of the cross section of TFC-RO membrane polyamide selective layer after in situ formation of Ag-NPs.

The first indication for successful reduction of silver on the membrane was a change of the membrane surface color from white to yellow-brown (FIG. 2). Higher $AgNO_3$ and $NaHB_4$ solution concentrations led to a darker yellow-brown membrane color, indicating a higher loading of silver on the membrane. In addition, the homogenous color indicates a uniform distribution of the reduced silver on the membrane. At relatively high SEM magnification of 45,000, there was no significant visual difference between in situ modified and pristine membrane (FIG. 3A, B). However, when the SEM magnification was increased to 100,000×, small particles covering the polyamide surface features were observed (FIG. 3C, D). It was important to understand the structure of the silver precipitates since formation of a continuous silver precipitate layer on the membrane surface would lead to surface blockage and severe reduction in membrane permeability, similar to membrane fouling by scaling. TEM micrographs confirmed that silver was not reduced as a continuous layer but rather as discrete spherical Ag-NPs with an approximate diameter of less than 15 nm (FIG. 4B, C). Thus, the yellow-brown color of the in situ modified membrane, observed by naked eye, originated from the typical plasmon adsorbance of Ag-NPs[59].

[59] Solomon, S. D., Bahadory, M., Jeyarajasingam, A. V., Rutkowsky, S. A., Boritz, C., Mulfinger, L., 2007. Synthesis and study of silver nanoparticles. Journal of Chemical Education 84 (2), 322-325.

TABLE S2

Elemental surface coverage (%) of pristine and in situ Ag-NPs modified membranes as measured by XPS. 1:1, 2:2 and 5:5 are the concentrations of $AgNO_3$:$NaHB_4$ (in mM) during the in situ formation of Ag-NPs reaction.

|  | Oxygen | Carbon | Nitrogen | Silver |
| --- | --- | --- | --- | --- |
| Pristine | 21.3 ± 1.9 | 70.3 ± 0.3 | 8.4 ± 1.6 | 0.0 ± 0 |
| 1:1 | 21.0 ± 1.3 | 70.3 ± 1.2 | 7.8 ± 0.1 | 0.89 ± 0.0 |
| 2:2 | 21.9 ± 0.5 | 68.8 ± 0.6 | 7.3 ± 0.6 | 2.0 ± 0.6 |
| 5:5 | 21.8 ± 1.0 | 68.2 ± 0.8 | 6.7 ± 0.3 | 3.2 ± 0.1 |

XPS measurements were performed to analyze the elemental composition of the in situ modified membrane (FIG. 4A). Unlike the spectrum of the pristine membrane where no silver signal was observed, a signal at binding energy of 364 eV (Ag 3d) was clearly seen in the spectra of the in situ modified membranes. Higher $AgNO_3$ and $NaHB_4$ concentrations during the in situ formation reaction resulted in stronger XPS signal, and silver surface coverage analysis showed a percent coverage of 0%, 0.89±0.02%, 2.0±0.64%, and 3.2±0.14% for the pristine membrane and 1:1, 2:2, and 5:5 in situ modified membranes, respectively (Table S2).

These observations confirmed the presence of silver on the membrane and the ability to control the silver loading on the membrane by changing the solution concentration. The other XPS peaks were related to oxygen, carbon, and nitrogen (peaks at 527, 396, 281 eV for O 1 s, N 1 s, and C 1 s, respectively), which appear in all the spectra (pristine and in situ modified membranes), as these elements are constituents of the polyamide layer.

Figure 5:
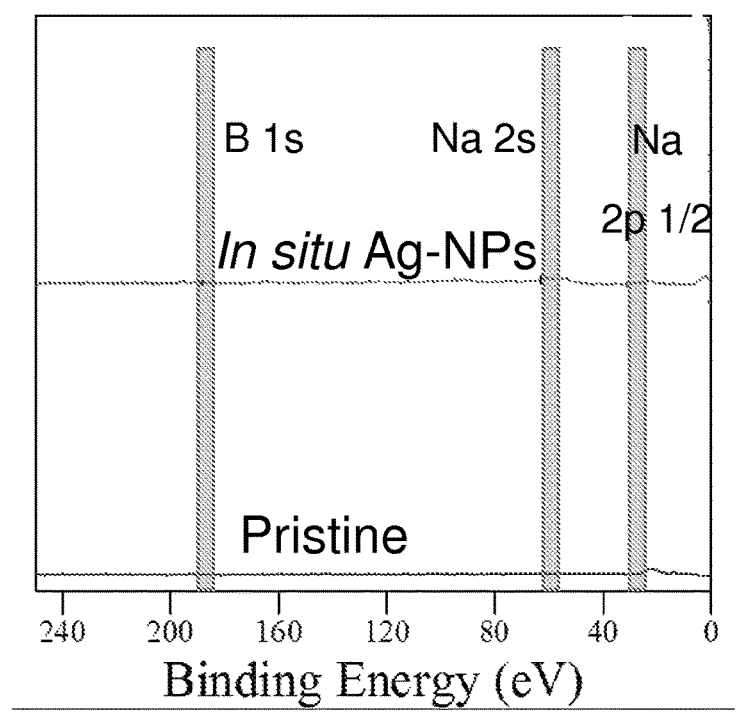
FIG. 5 illustrates an elemental surface analysis by XPS of pristine and 5:5 (Ag:$BH_4$ in mM) in situ Ag-NPs modified membrane.

According to the surface elemental analysis (Table S2), the nitrogen/carbon ratio at the membrane surface was slightly reduced for the in situ modified membranes. This reduction in N/C ratio (up to 18%), likely due to masking of the polyamide amine group by the Ag-NPs, indicates a decrease in the nitrogen coverage and implies that nitrogen (from the precursor $AgNO_3$ solution) had no significant content in the formed Ag-NPs. The oxygen/carbon ratio on the membrane surface exhibited a maximal increase of 5%, indicating possible minor addition of oxygen to the membrane surface due to Ag-NP loading. The tendency of silver to be oxidized leading to formation of thin oxidation layer on Ag-NPs was previously established[60] and may explain the minor increase of oxygen on the in situ modified membrane. The absence of peaks typical to boron and sodium (B 1s—188 eV, Na 2s—63 eV, and Na 2p—31 eV; FIG. 5) in the in situ modified membrane spectra indicates that these elements, which participated in the in situ formation procedure, were absent in the Ag-NPs. Therefore, by elimination, it can be concluded that the in situ reduced Ag-NPs on the membrane comprised only metallic silver potentially coated with a thin oxidized layer.

[60] Li, X. A., Lenhart, J. J., Walker, H. W., 2010. Dissolution-accompanied aggregation kinetics of silver nanoparticles. Langmuir 26 (22), 16690-16698.

Figure 6:
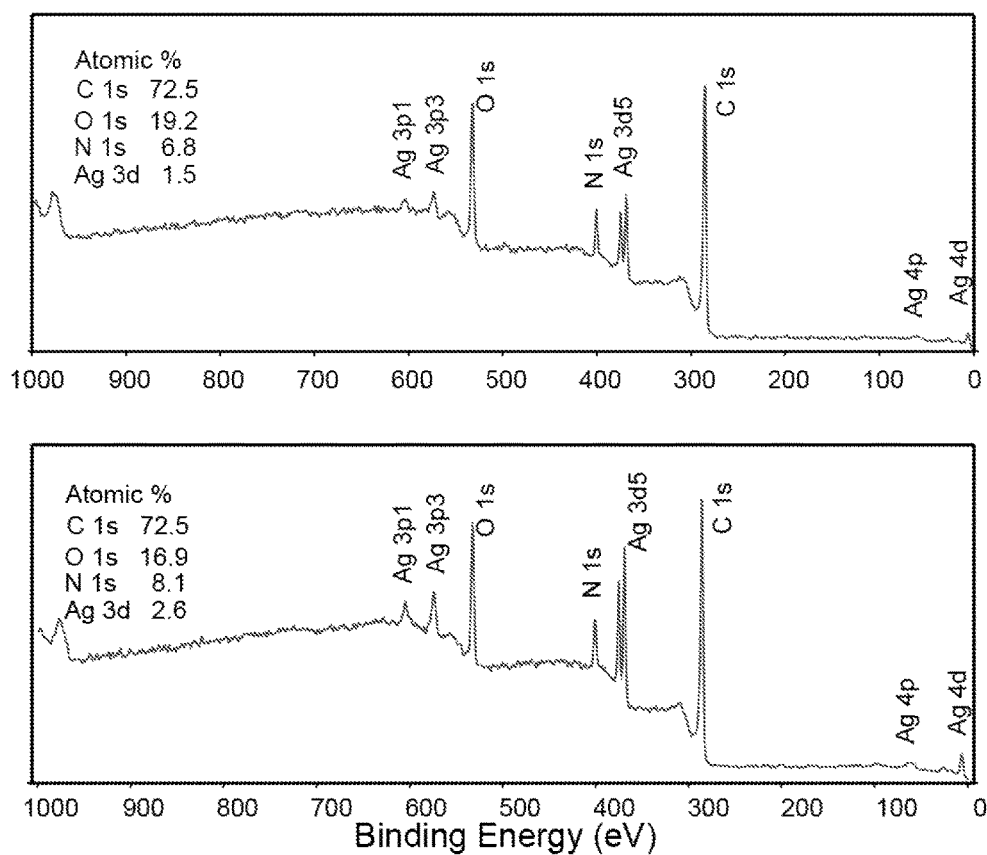
FIG. 6 is an XPS spectra of in situ Ag-NPs modified membrane (5:5) with no sonication (A) and after 5 mM sonication in DI water (B) (the observed silver peaks demonstrate that the Ag-NPs remained on the membrane surface after sonication).

Because of the relatively high hydrodynamic shear inside the membrane module during operation, it is important to demonstrate the affinity of the in situ formed Ag-NPs to the membrane surface. A 5:5 in situ modified membrane was sonicated for 5 min in DI water and then analyzed by XPS. The visual yellow-brownish color that remained after sonication and the observed Ag related peaks in XPS spectra (FIG. 6) demonstrate that Ag-NPs were strongly attached to the in situ formed Ag-NPs to membrane surface.

(b) Impact on Membrane Properties

Many applications of RO, like seawater desalination, require membranes with very high salt rejection (~99%) and high water permeability[61]. In addition, membrane surface properties (e.g., roughness, hydrophilicity, and surface charge) will dictate the fouling propensity of the membrane[62,63]. Therefore, it was important to ascertain that the Ag-NP in situ formation on the membrane properties had negligible impact on membrane surface properties.

[61] Lee, K. P., Arnot, T. C., Mattia, D., 2011. A review of reverse osmosis membrane materials for desalination-development to date and future potential. Journal of Membrane Science 370 (1-2), 1-22.
[62] Elimelech, M., Phillip, W. A., 2011. The future of seawater desalination: Energy, technology, and the environment. Science 333 (6043), 712-717.
[63] Vrijenhoek, E. M., Hong, S., Elimelech, M., 2001. Influence of membrane surface properties on initial rate of colloidal fouling of reverse osmosis and nanofiltration membranes. Journal of Membrane Science 188 (1), 115-128.

Figure 7:
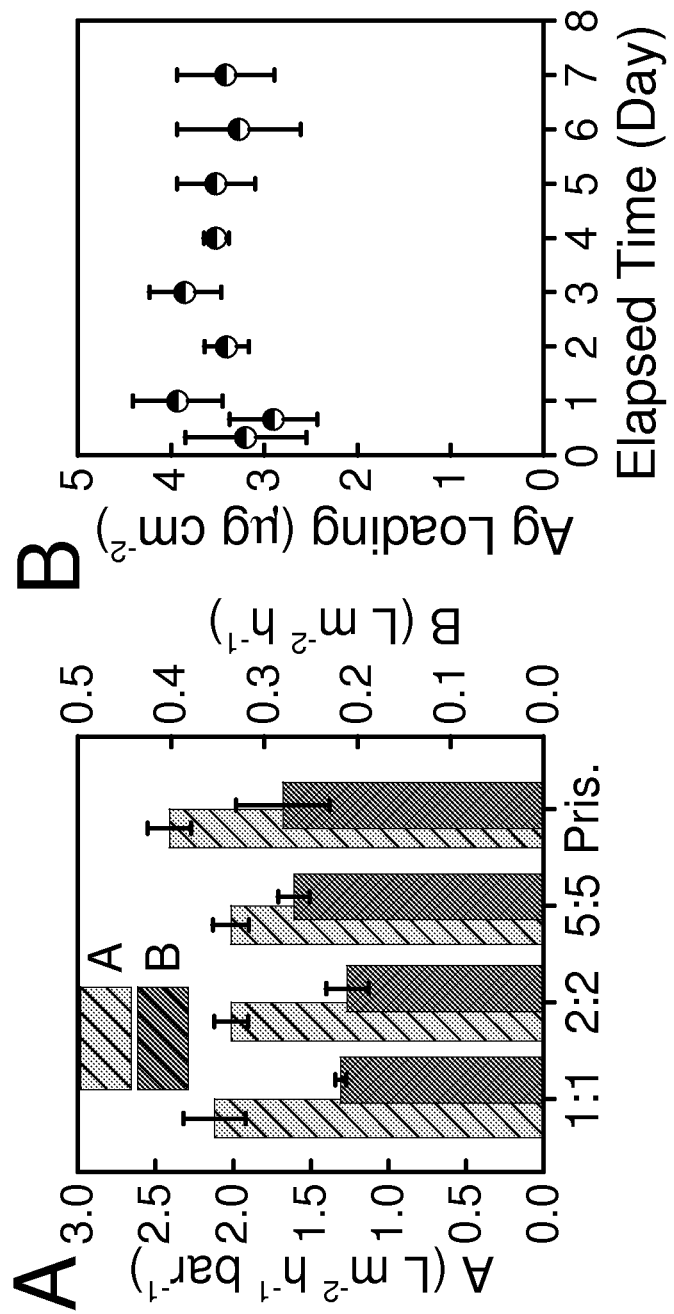
FIG. 7(A) illustrates water permeability coefficient, A, and salt permeability coefficient, B, of pristine and in situ Ag-NPs modified membranes prepared with different Ag:$BH_4$ solution concentrations (in mM; 1:1 is 1 mM Ag and 1 mM $BH_4$, etc.) (experimental conditions: pressure of 27.5 bar (400 psi), crossflow velocity of 21.4 cm/s, temperature of 25.0±0.5° C., and 50 mM NaCl).
FIG. 7(B) illustrates residual silver loading on in situ Ag-NPs modified membrane (5:5) after dissolution for several days in 10 mL of 5 mM $NaHCO_3$ solution (pH 8.3).

The water permeability coefficient (A) decreased from 2.41±0.14 for the pristine membrane to 2.12±0.20, 2.01±0.10, and 2.01±0.12 L m$^{-2}$ h$^{-1}$ bar$^{-1}$ for the 1:1, 2:2, and 5:5 in situ modified membranes, respectively (FIG. 7A). These values reflect a maximum reduction in permeability of 17% due to the in situ formation reaction. Salt rejection values were 98.85±0.26%, 98.64±0.01%, 98.63±0.1%, and 98.33±0.2% for the pristine membrane and the 1:1, 2:2, and 5:5 in situ modified membranes, respectively. The calculated values of the salt permeability coefficient (B) decreased slightly from 0.28±0.05 for the pristine membrane to 0.22±0.01, 0.21±0.02, and 0.27±0.02 L m$^{-2}$ h$^{-1}$ for the 1:1, 2:2, and 5:5 in situ modified membranes, respectively (FIG. 7A).

The decrease in membrane water permeability is likely attributed to the deposited Ag-NPs on the membrane, which lowered the effective membrane surface area for water flow. The observed moderate reduction in membrane water permeability while maintaining the membrane salt selectivity further indicates that the polyamide layer properties were not greatly affected by the in situ formation reaction. This minimal impact on the intrinsic properties of the polyamide layer is related to the selective reduction of silver by NaBH$_4$ at the low concentrations used.

Key membrane surface properties that impact fouling propensity—surface charge, hydrophilicity, and roughness—were also not significantly affected by the in situ formation of the Ag-NPs on the membrane surface. The in situ modified membrane (5:5) and the pristine membrane exhibited comparable zeta potential versus pH curves (FIG. 8A). Also the measured contact angles for the in situ modified membranes were only slightly different than the pristine membrane (FIG. 8B). Due to the small size (~15 nm) of the in situ modified Ag-NPs, a minimal increase in surface roughness parameters was observed with root mean squared surface roughness ($R_{rms}$) of 107±15, 139±26, 115±14, and 123±19 nm for the pristine and 1:1, 2:2, and 5:5 in situ modified membranes, respectively (values of other surface roughness parameter can be found in Table S5).

TABLE S5

Surface morphology of pristine and in situ Ag-NPs modified membranes

| | Control | In Situ Reduction | | |
|---|---|---|---|---|
| | | 1:1 | 2:2 | 5:5 |
| $R_{rms}{}^a$ (nm) | 107 ± 15 | 139 ± 26 | 115 ± 14 | 123 ± 19 |
| $R_a{}^b$ (nm) | 80 ± 12 | 107 ± 24 | 95 ± 7 | 95 ± 15 |
| $R_{max}{}^c$ (nm) | 880 ± 130 | 1029 ± 65 | 1064 ± 128 | 954 ± 124 |
| SAD$^d$ (%) | 20.2 ± 6.2 | 28.4 ± 10.5 | 37.0 ± 10.2 | 30.9 ± 14.1 |

$^a$Root mean squared roughness ($R_{rms}$): the RMS deviation of the peaks and valleys from the mean plane.
$^b$Average roughness ($R_a$): arithmetic average of the absolute values of the surface height deviations measured from the mean plane.
$^c$Maximum roughness ($R_{max}$): the maximum vertical distance between the highest and lowest data points in the image following the plane fit.
$^d$Surface area difference (SAD): the increase in surface area (due to roughness) over a perfectly flat plane with the same projected area.

(c) Ag-NPs Dissolution Tendency

Since Ag-NPs dissolve in aqueous solutions, we assessed the potential long-term use of the in situ reduced Ag-NPs by examining the residual silver loading on the membrane after days of dissolution. Silver ion dissolution from Ag-NPs highly depends on the solution chemistry and pH[64,65,66]. We examined the dissolution of the Ag-NPs (5:5) membrane in a solution buffered by NaHCO$_3$ at pH 8.2-8.3, similar to pH of seawater and wastewater. Our results indicate that the residual silver on the membrane after one week of dissolution remained roughly unchanged at ~3.5 µg cm$^{-2}$ (FIG. 7B). The amount of silver ions that were dissolved in the media was also constant all over the 7 days of dissolution, with values of 5.5±0.6% relative to the residual silver loading on the membrane. However, we emphasize that in RO plants the Ag-NP dissolution rate will likely be higher due to the more complex solution chemistry. Also the hydrodynamic conditions near the membrane surface will impact the Ag-NP dissolution rates.

[64] Levard, C., Mitra, S., Yang, T., Jew, A. D., Badireddy, A. R., Lowry, G. V., Brown, G. E., 2013. Effect of chloride on the dissolution rate of silver nanoparticles and toxicity to e. Coli. Environmental Science & Technology 47 (11), 5738-5745.
[65] Li, X. A., Lenhart, J. J., Walker, H. W., 2010. Dissolution-accompanied aggregation kinetics of silver nanoparticles. Langmuir 26 (22), 16690-16698.
[66] Liu, J. Y., Hurt, R. H., 2010. Ion release kinetics and particle persistence in aqueous nano-silver colloids. Environmental Science & Technology 44 (6), 2169-2175.

(d) Variances of the In Situ Formation Method

The loading time of Ag-NPs on RO-TFC membrane by the in situ formation procedure was relatively fast (15 min). This procedure was divided into two main stages. The first stage lasted for 10 min, in which AgNO$_3$ solution was contacted with the membrane surface. This stage was designed to allow the diffusion of the silver ions (Ag$^+$) to the vicinity of the membrane surface and possible partial complexion with the native carboxylic groups on the membrane[67,68]. In the second stage, which lasted for 5 min, the silver ions were reduced by NaBH$_4$ to form Ag-NPs on the membrane. In this stage, after 1-2 minutes a clear brown-yellow coverage of the membrane was seen. Since the times of these two in situ reduction stages were arbitrarily determined, it should be possible to shorten even more the total Ag-NP loading time in the in situ reduction procedure.

[67] Joly, S., Kane, R., Radzilowski, L., Wang, T., Wu, A., Cohen, R. E., Thomas, E. L., Rubner, M. F., 2000. Multilayer nanoreactors for metallic and semiconducting particles. Langmuir 16 (3), 1354-1359.
[68] Li, Z., Lee, D., Sheng, X. X., Cohen, R. E., Rubner, M. F., 2006. Two-level antibacterial coating with both release-killing and contact-killing capabilities. Langmuir 22 (24), 9820-9823.

Figure 9:
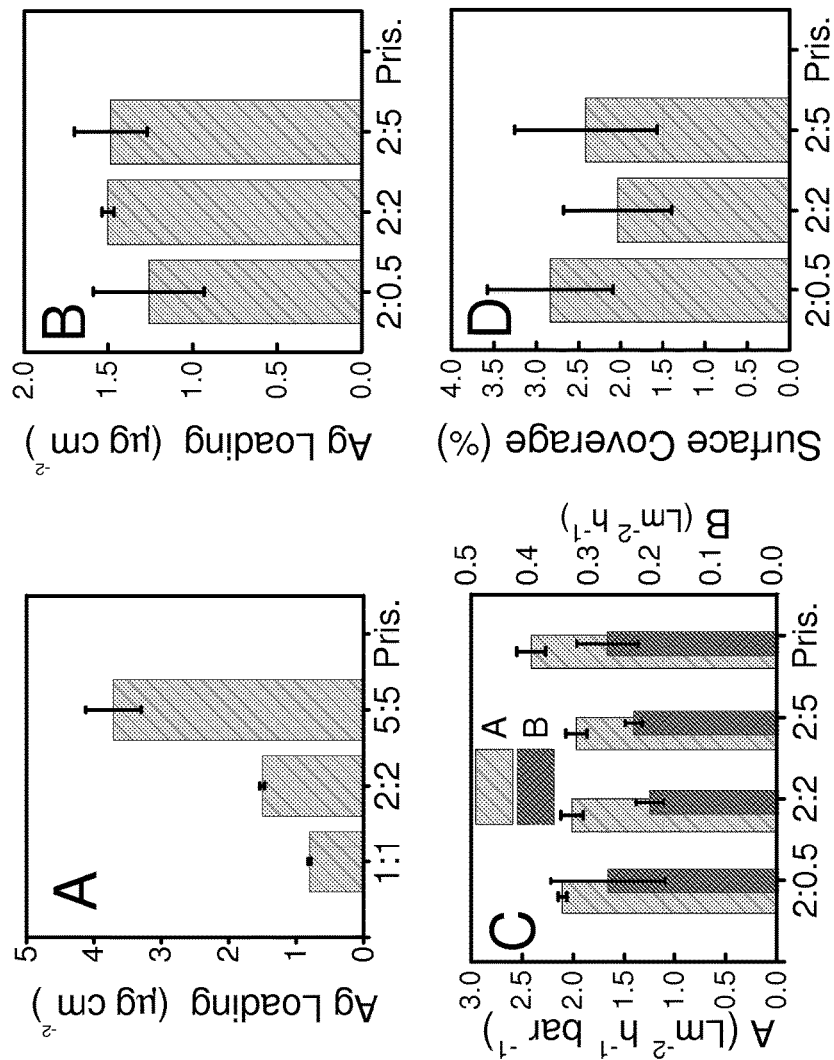
FIG. 9(A) illustrates silver loading on the membrane surface after in situ formation reaction with different Ag:$BH_4$ concentrations (1:1, 2:2, and 5:5 in mM, Pris. means pristine membrane).
FIGS. 9(B), 9(C) and 9(D) illustrate silver loading, elemental surface coverage, and membrane intrinsic transport properties, respectively (water permeability—A, salt permeability coefficient—B), for in situ Ag-NPs modified membranes when silver concentration was constant (2 mM) and different $BH_4$ concentrations were applied (0.5, 2, and 5 mM).

Three concentrations of AgNO$_3$ and NaHB$_4$ were examined in the in situ formation procedure: 1:1, 2:2, and 5:5 mM of AgNO$_3$:NaHB$_4$. As the concentration of AgNO$_3$:NaBH$_4$ increased, the measured silver loading on the membrane also increased, with values of 0.8±0.02, 1.5±0.03, and 3.7±0.4 µg cm$^{-2}$ for the 1:1, 2:2, and 5:5 in situ modified membranes, respectively (FIG. 9A). These silver loadings demonstrate a linear relationship ($R^2$=0.99) between solution concentration and silver loading. However, since both the concentration of silver and sodium borohydride were varied, in order to understand whether silver concentration or borohydride concentration dictated the silver loading on the membrane, a fixed AgNO$_3$ concentration of 2 mM was in situ reduced by 0.5, 2, and 5 mM NaBH$_4$. The measured silver loadings on the membrane were 1.25±0.33, 1.5±0.03, and 1.48±0.22 µg cm$^{-2}$ for the 0.5, 2 and 5 mM NaBH$_4$, respectively (FIG. 9B). The surface coverage as calculated by XPS was 2.84±0.74%, 2.04±0.64%, and 2.42±0.84% for the 2:0.5, 2:2, and 2:5 in situ modified membranes, respectively (FIG. 9D). In addition, the water permeability and salt selectivity of the in situ modified membranes were not statistically different for the three types of NaBH$_4$ concentration used (FIG. 9C, Table S6). Consequently, it can be concluded that the silver salt concentration determines the silver loading on the membrane and not the NaBH$_4$. This observation raises the opportunity for chemical saving by lowering the amount of NaBH$_4$ used.

TABLE S6

Transport properties of pristine and of in situ Ag-NPs modified membranes for different concentrations of BH$_4$ solution: A - water permeability, R - salt rejection, B - salt permeability, coefficients. During the in situ formation reaction the concentration of AgNO$_3$ solution was fixed to be 2 mM and the concentration of NaBH4 was changed to 0.5, 2 and 5 mM. (2:0.5 represent 2 AgNO$_3$: 0.5 NaBH$_4$ (in mM) etc.).

| | A (L m$^{-2}$ h$^{-1}$ bar$^{-1}$) | R (%) | B (L m$^{-2}$ h$^{-1}$) |
|---|---|---|---|
| Pristine | 2.41 ± 0.14 | 98.85 ± 0.26 | 0.28 ± 0.05 |
| 2:0.5 | 2.11 ± 0.04 | 98.38 ± 0.46 | 0.21 ± 0.09 |
| 2:2 | 2.01 ± 0.10 | 98.63 ± 0.1 | 0.21 ± 0.02 |
| 2:5 | 1.97 ± 0.10 | 98.55 ± 0.04 | 0.24 ± 0.01 |

(e) Antibacterial Activity of In Situ Modified Membrane

Figure 8:
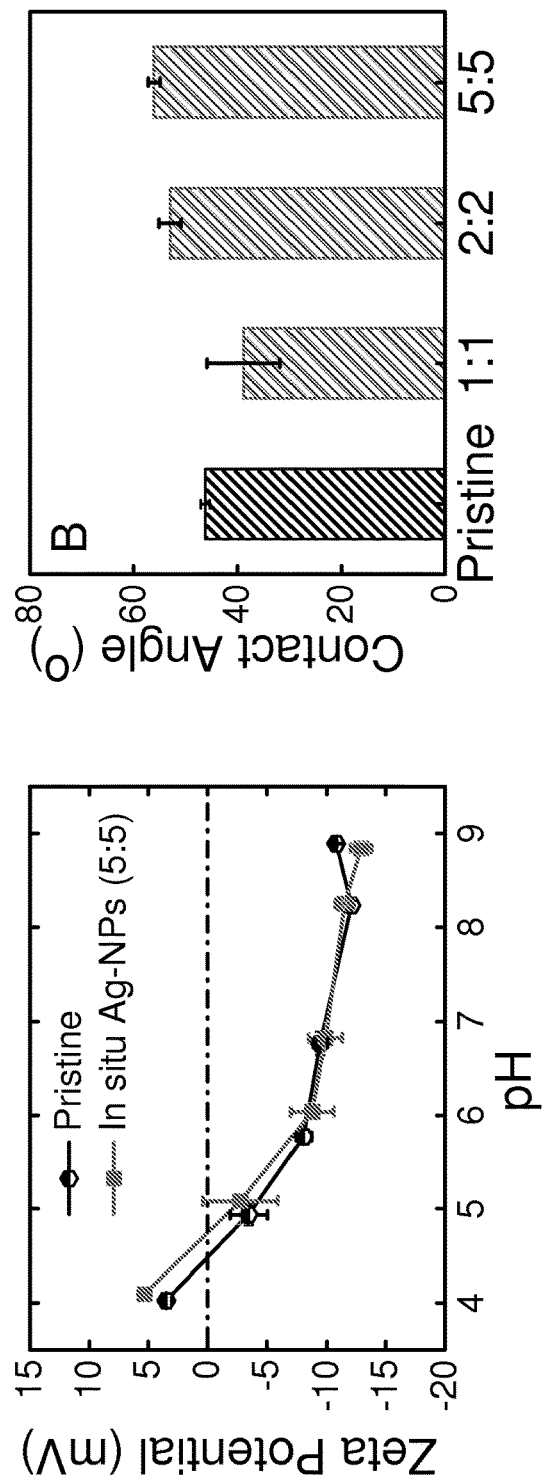
FIG. 8(A) illustrates membrane surface charge represented by zeta potential.
FIG. 8(B) illustrates membrane surface hydrophilicity represented by contact angle measurements (notations 1:1, 2:2 and 5:5 mean Ag:$BH_4$ concentrations (in mM) during the in situ Ag-NPs formation reaction).
Figure 10:
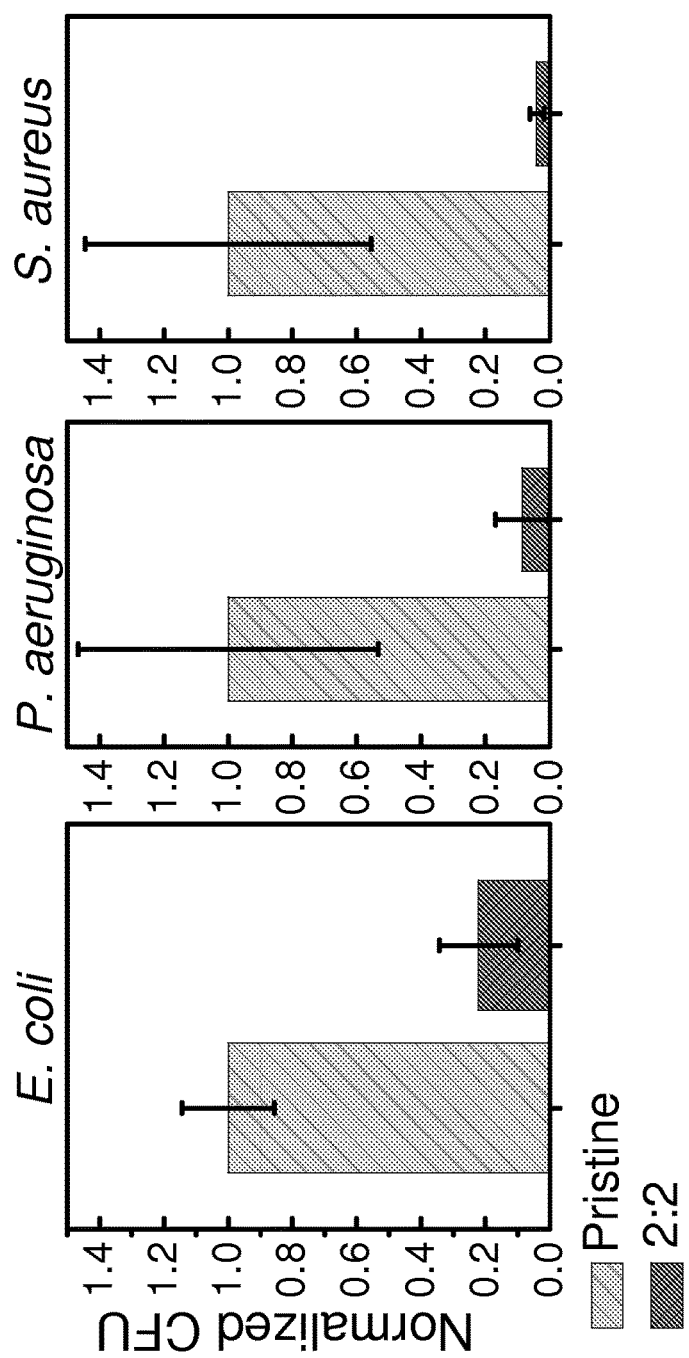
FIG. 10 illustrates the number of attached live bacteria colonies (CFU) on pristine (grey) and in situ Ag-NPs modified membranes (green) for gram negative (*E. coli* and *P. aeruginosa*) and gram positive (*S. aureus*) bacteria (experimental conditions: pristine and in situ modified (2:2 Ag:$BH_4$) membranes were contacted and incubated with isotonic solution (0.15M NaCl; 20 mM $NaHCO_3$ as buffer, pH 8.2) with bacteria ($OD_{600}$: 0.15±0.01) for 5 h at 37° C.; after incubation the membranes were sonicated with sterile isotonic solution and the detached bacteria were plated on LB agar).
Figure 11:
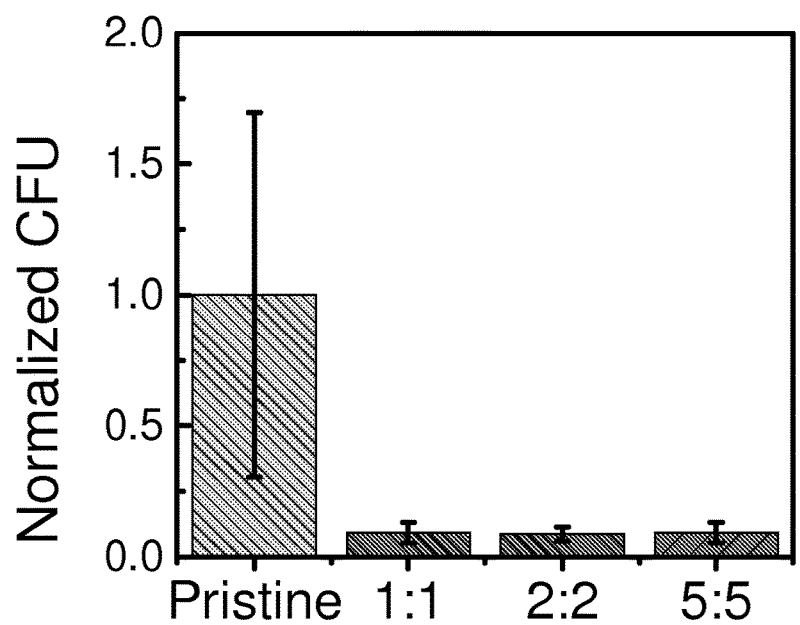
FIG. 11 illustrates the number of attached live bacteria on pristine (green) and membrane with in situ formed Ag-NPs (gray) for *E. coli* bacteria (1:1, 2:2, 5:5 means Ag:$BH_4$ concentrations in mM, respectively) (experimental conditions: pristine and in situ Ag-NPs modified membranes were contacted with isotonic solution (0.15M NaCl; 20 mM $NaHCO_3$ as buffer, pH 8.2) with bacteria ($OD_{600}$: 0.15) for 2 h at 37° C.; after incubation the membranes were sonicated with sterile isotonic solution and the detached bacteria were plated on LB agar).
Figure 12:
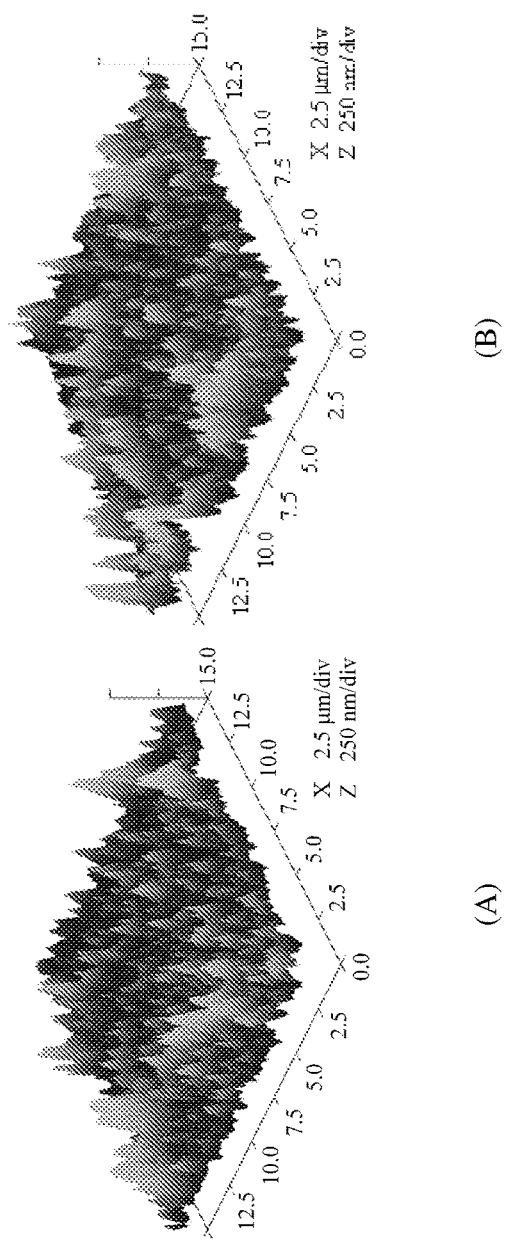
FIG. 12 illustrates three-dimensional AFM images of: (A) control polyamide membrane, and (B) in situ Ag-NPs modified membrane (5:5) (note that the X and Y dimensions are both 15 μm (2.5 μm/division), while the Z-scale is 500 nm (250 nm/division)).
Figure 13:
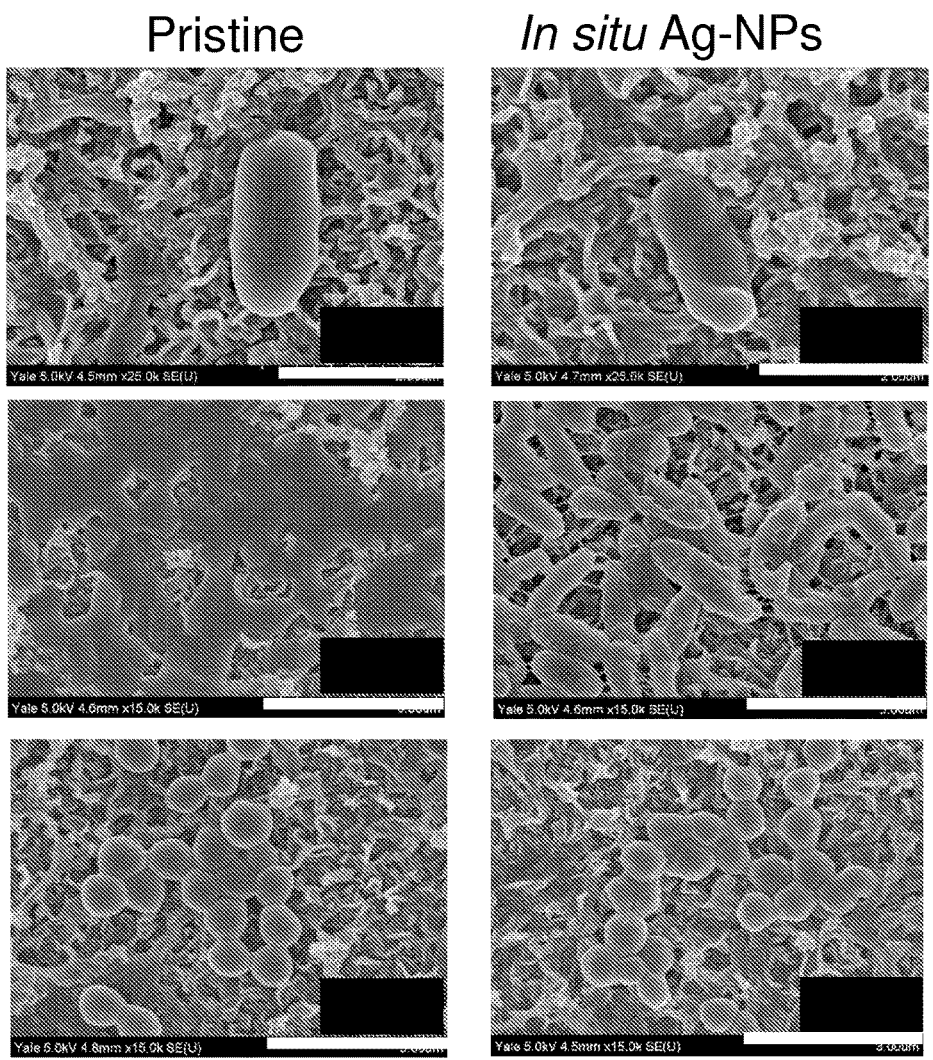
FIG. 13 illustrates SEM micrographs of bacteria morphology: *E. coli* on pristine membrane (A) and on 2:2 in situ Ag-NPs modified membrane (B); *P. aeruginosa* on pristine membrane (C) and 2:2 on in situ Ag-NPs modified membrane (D); *S. aureus* on pristine membrane (E) and on 2:2 in situ Ag-NPs modified membrane (F); experimental conditions were 5 h incubation of bacteria solution with the membranes (initial $OD_{600}$: 0.15±0.9, 0.15M NaCl; 20 mM $NaHCO_3$ as buffer, pH 8.2).

Modifying the RO membrane with Ag-NPs imparted a strong antibacterial activity to the membrane surface. After 5 hour of incubation with the 2:2 in situ modified membrane, the number of vial E. coli, P. aeruginosa, and S. aureus bacteria colonies (CFU) decreased by 78±12%, 91±8%, and 96±2.2%, respectively, compared to the pristine membrane (FIG. 10). In order to examine the effect of silver loading on the antibacterial activity, E. coli bacteria were contacted with pristine and in situ modified membranes for 2 h. A decrease of 90.7±3.8%, 91.2±2.6%, and 90.7±3.8% in the number of viable bacteria colonies for the 1:1, 2:2, and 5:5 in situ modified membranes compared to the pristine membrane was observed (FIG. 11). These observations demonstrate the strong antibacterial activity of the modified membrane on gram negative and gram positive bacteria in relatively low silver loadings. No differences in the adhesion propensities of the bacteria to the membrane were expected since the surface properties (hydrophilicity, surface roughness, and zeta potential) of the modified and pristine membranes were similar (FIGS. 8 and 12, Table S5). Thus, it can be inferred that the profound decrease in the number of attached live bacteria was mainly due to the toxicity of Ag-NPs. SEM micrographs validate the cytotoxicity of Ag-NPs by demonstrating changes in bacteria morphology on the modified membrane compared to the pristine membrane, especially for P. aeruginosa and E. coli (FIG. 13).

Figure 14:
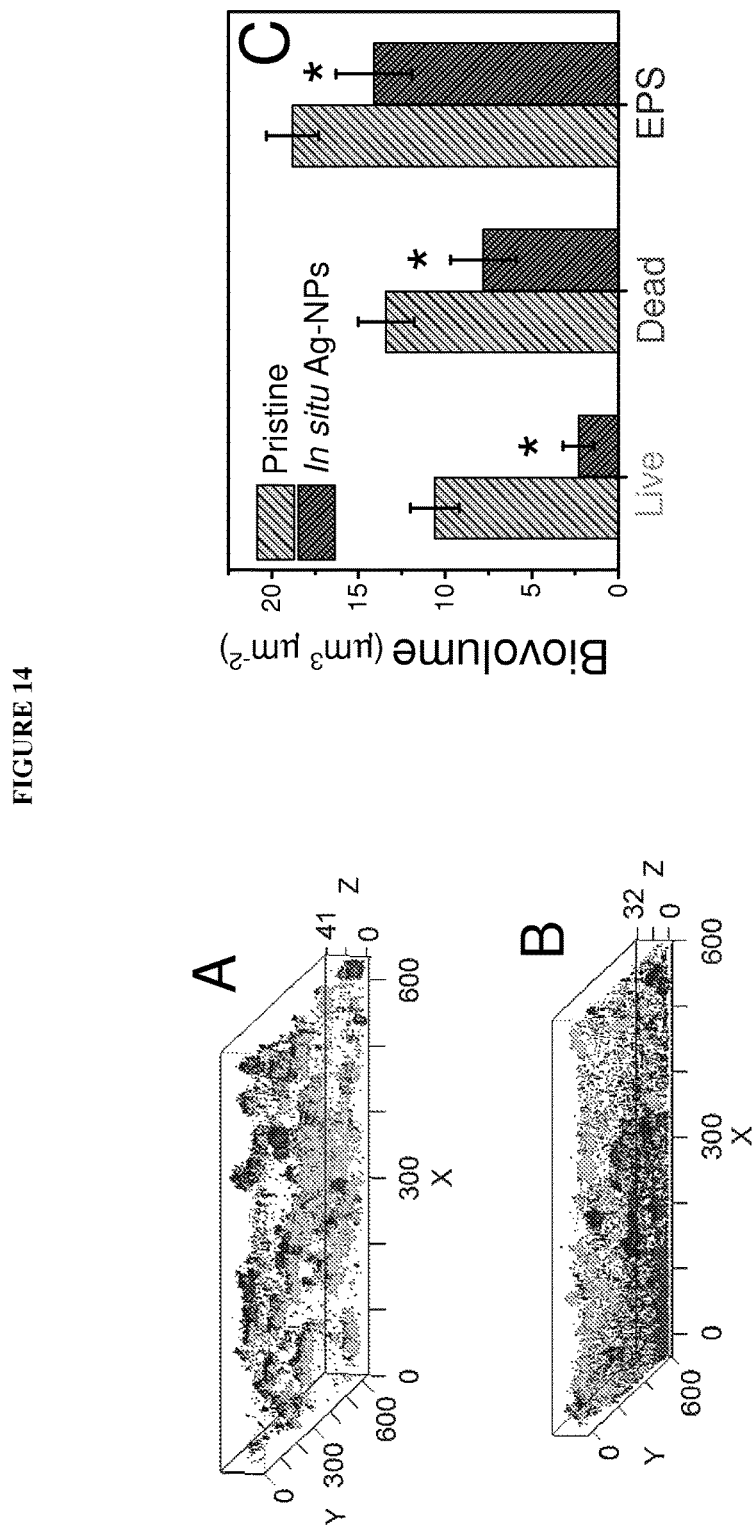
FIG. 14 illustrates CLSM 3-D images of *P. aeruginosa* biofilm structures grown over 24 h on pristine (A) and on 5:5 in situ Ag-NPs modified membrane (B) (biofilms were stained with Con A (blue), SYTO® 9 (green) and PI (red) dyes specific for EPS (polysaccharides), live and dead cells, respectively—note all axes units are in micrometers), and (C) corresponding dead, live and EPS biovolumes calculated from CLSM image stacks of a pristine and 5:5 in situ Ag-NPs modified membrane (asterisks above the bars represent significant (P<0.05) difference between groups).

In addition, biofilm development was significantly suppressed on the in situ Ag-NP membrane coupons indicated by the CLSM imaging and analysis of biovolume dimensions (FIG. 14). Biovolume on in situ Ag-NP membrane compared to pristine membrane reduced by 73%, 38%, and 25% for live, dead, and EPS (respectively), leading to total (live+dead+EPS) biovolume reduction of 41%. During 24 h of biofilm growth, the toxicity of the in situ formed Ag-NPs led to the killing and reduction of the number of live bacteria on the membrane, thus, the ability of the live bacteria to proliferate and to release EPS was suppressed, following by diminishing of overall biofilm formation.

(f) Conclusion

Applying Ag-NPs as biocides in RO processes requires thorough understanding of the Ag-NP loading method. While previous work demonstrated Ag-NPs strong antibacterial activity, their suggested Ag-NP loading methods did not address all of the constraints found in an industrial RO plant. These constraints require gentle, simple, rapid, and inexpensive procedure for Ag-NP loading that can be repeated without disassembling the membrane module. Additionally, the loading method must maintain the unique RO membrane properties. The in situ Ag-NP formation procedure demonstrated here is simple, rapid (15 min), very efficient in terms of chemical usage, and can be repeatedly applied directly inside the membrane module. Moreover, beside minor reduction in membrane permeability, the unique transport and surface properties of the membrane maintained. Both significant reduction in the number of attached live bacteria in static tests and suppression of biofilm development demonstrated the strong antibacterial activity by the in situ formed Ag-NPs. Therefore, this loading procedure greatly improves upon previously presented membrane modification methods, justifying future research that focuses on understanding the mechanisms and assessing the potential of Ag-NPs for mitigation of biofouling in RO processes.

B. Copper Nanoparticles (Cu-NPs)

i) In Situ Formation of Cu-NPs on TFC RO Membrane

Figure 15:
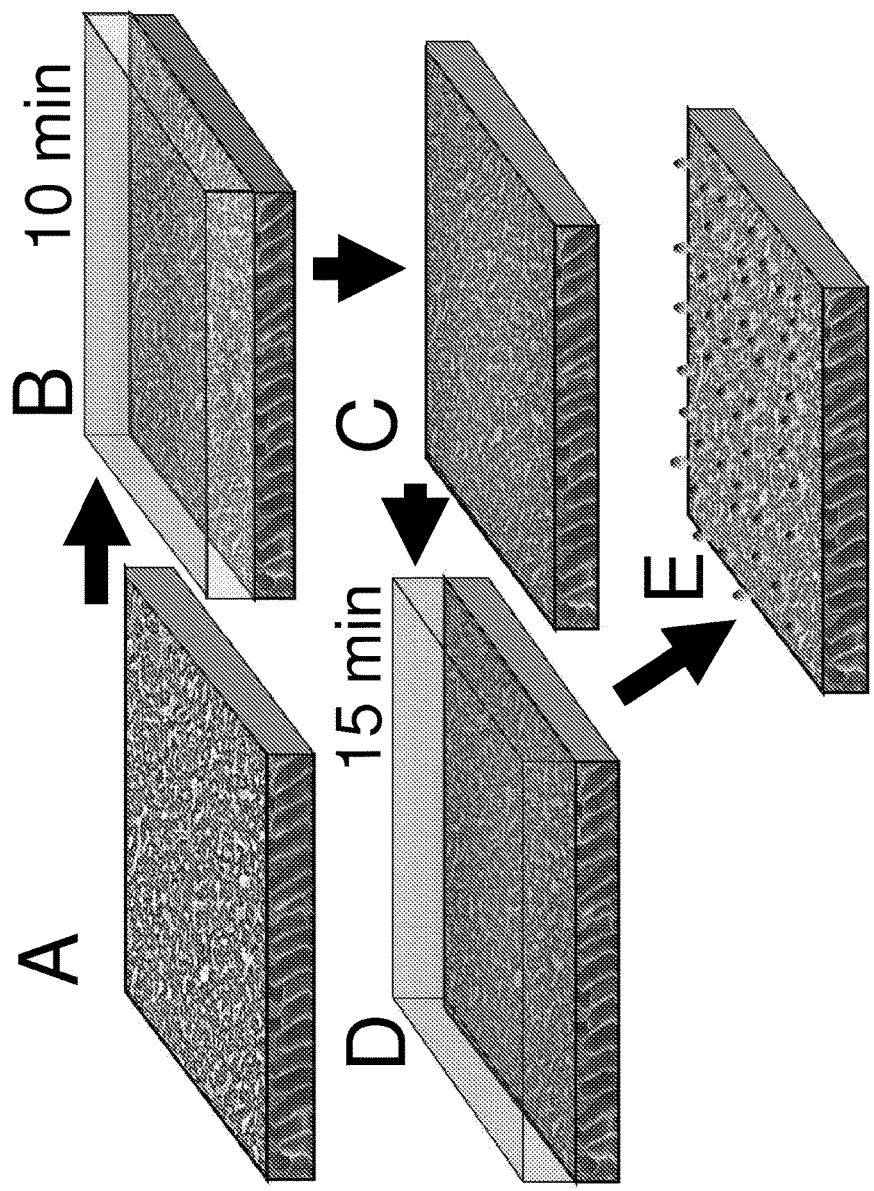
FIG. 15 is a schematic diagram of in situ formation of Cu-NPs on a TFC RO membrane: pristine RO membrane (A) is covered with $CuSO_4$ solution (pale blue; 50 mM) for 10 minutes (B), then, the $CuSO_4$ solution is discarded leaving a thin layer of the $CuSO_4$ solution on the surface (C), next, the membrane is recoated with $NaBH_4$ solution (20-50 mM) for 5 minutes (D) to cover the membrane surface with Cu-NPs (E).

In situ formation of Cu-NPs on the RO membrane was conducted in a similar procedure as in the situ formation of Ag-NPs, but with copper salts instead of silver, different concentration of $NaBH_4$, and longer reaction time. Initially, 10 mL of $CuSO_4$ solution (50 mM) was reacted with the isolated active layer for 10 min (FIG. 15B). Subsequently, the $CuSO_4$ solution was discarded, leaving only thin layer of $CuSO_4$ solution on the membrane surface (FIG. 15C). Then, the membrane active layer was reacted with a $NaBH_4$ (20-50 Mm) solution for 15 min (FIG. 15D), forming copper nanoparticles. After formation of Cu-NPs, the $NaBH_4$ solution was removed from the membrane (FIG. 15E), and the prepared in situ Cu-NPs modified membrane was rinsed for ~10 s with DI water. All in situ reactions were done at ambient conditions.

The concentration of the above-noted $CuSO_4$ solution can be from 0.1 mM to 200 mM, preferably from 0.1 mM to 100 mM, more preferably from 1 mM to 80 mM, even more preferably from 25 mM to 75 mM, and most preferably about 50 mM.

The concentration of the above-noted $NaBH_4$ solution can be from 0.1 mM to 200 mM, preferably from 1 mM to 150 mM, more preferably from 5 mM to 100 mM, even more preferably from 10 mM to 75 mM, and most preferably from 20 mM to 50 mM.

The above-noted reaction time for reacting the $CuSO_4$ solution with the isolated active layer can be from 0.5 minutes to 30 minutes, preferably from 1 minute to 25 minutes, more preferably from 2 minutes to 20 minutes, even more preferably from 5 minutes to 15 minutes, and most preferably about 10 minutes.

The above-noted reaction time for reacting the membrane active layer with the $NaBH_4$ solution can be from 0.5 minutes to 60 minutes, preferably from 1 minute to 45 minutes, more preferably from 5 minutes to 30 minutes, even more preferably from 10 minutes to 20 minutes, and most preferably about 15 minutes.

The above-noted rinsing time for rinsing the prepared in situ Cu-NPs modified membrane can be from 1 second to 10 minutes, preferably from 1 second to 5 minutes, more preferably from 1 second to 1 minute, even more preferably from 1 second to 30 seconds, and most preferably about 10 seconds.

ii) Quantifying of Copper Loading

Copper loading on the membrane was quantified with SEM and XPS using the same methodology as described above for the Ag-NP in situ formation.

iii) Membrane Characterization

Intrinsic membrane transport properties (A, B, and R) and surface characteristics (contact angle, zeta potential, and AFM—surface roughness) measurements were conducted following the same methodology as described above for the Ag-NP in situ formation.

iv) Antimicrobial Activity of Cu-NP Functionalized Membranes

The antimicrobial properties of the membrane were assessed using E. coli as model bacteria. An overnight culture of bacteria (1 mL) grown in LB was diluted in 24 mL fresh LB broth and grown for 2-3 hours to exponential phase. Viable cell attachment experiments were carried out to quantify the number of live bacteria attached to pristine and in situ modified (50 mM $CuSO_4$: 50 mM $NaBH_4$) membranes. The bacteria culture was centrifuged for 1 minute at 5,000 rpm (Eppendorf 5415D) in 1 mL centrifuge tubes, and resuspended in isotonic saline solution (0.15 M NaCl, 20 mM $NaHCO_3$, pH 8.2) to an initial $OD_{600}$ of 0.15±0.09. Circular membrane coupons (3.8 $cm^2$) were placed in sterile plastic tubes with the bacteria in an isotonic (saline) solution. Only the membrane polyamide active layer was exposed to the bacteria suspension during incubation. The tubes were incubated for 2 h (37° C.). After incubation, the membranes were rinsed gently with DI water to remove unattached bacteria. Membrane coupons were then bath-sonicated for 7 min in 10 mL of isotonic solution to remove the attached bacteria. The suspension was diluted, plated on LB agar plates, incubated overnight following which bacteria colonies were counted.

vi) Chemicals

The used chemicals are described in the chemical list of Ag-NP in situ formation procedure.

vii) Model Bacteria Strains

Kanamycin resistant *Escherichia coli* (*E. coli*) BW26437 was received from the Yale *Coli* Genetic Stock Center (New Haven, Conn.). Cultures were maintained on LB agar plates and grown in LB media prior to experiments. LB agar plates for *E. coli* included 25 mg/L kanamycin sulfate (American Bioanalytical).

viii) Results (a) In Situ Formation of Cu-NPs on the Membrane Surface

Figure 16:
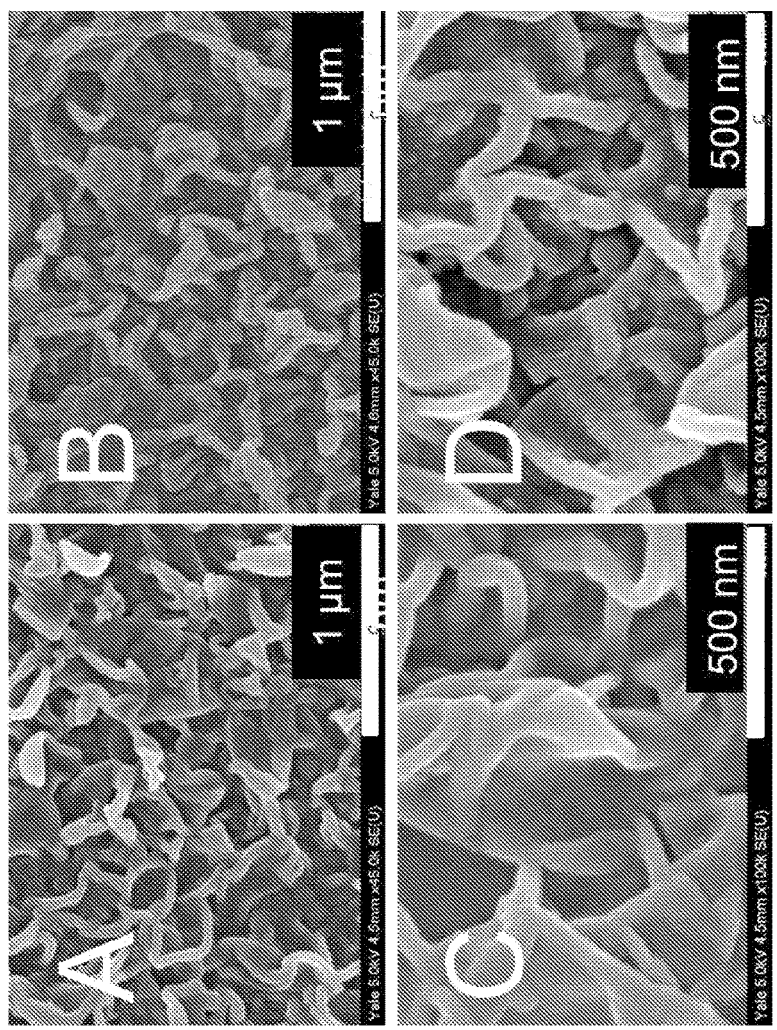
FIG. 16 is SEM micrographs of (A, C) pristine and (B, D) in situ Cu-NP modified active layer of TFC membrane at different magnifications as indicated (solutions of 50 mM $CuSO_4$ and 50 mM $NaBH_4$ (50:50) were used during the in situ formation reaction).
Figure 17:
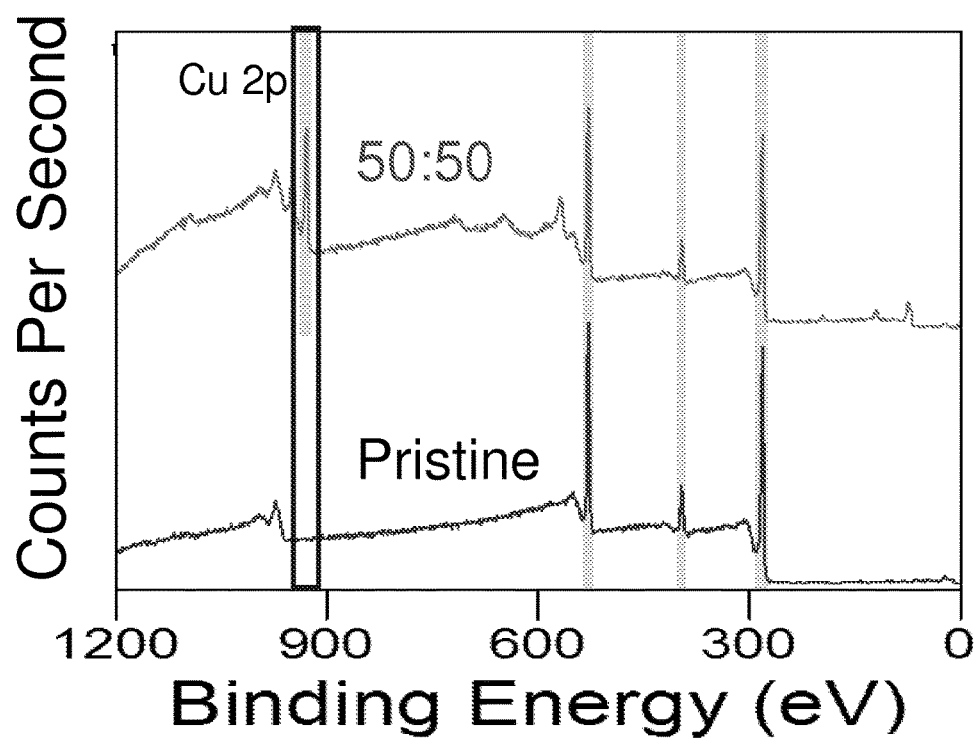
FIG. 17 is an XPS spectra of pristine (red) and functionalized TFC membrane with in situ formed Cu-NPs (green) with 50:50-Cu:$BH_4$ solution concentrations (in mM); the peaks at 932 eV are related to the presence of copper.

Cu-NPs were successfully in situ formed on the face of the polyamide layer as can be clearly seen in SEM micrographs (FIG. 16). Since the Cu-NPs were observed even in 45K magnification, it can be inferred that the in situ formed Cu-NPs are larger than the 15 nm in situ formed Ag-NPs which were not seen at that magnification (FIG. 3B). XPS measurement reinforced the evidence for successful coverage of Cu-NPs on the membrane by indicating peaks related to the presence of copper at 932 eV, which were not seen in the pristine membrane spectra (FIG. 17).

(b) Impact on Membrane Properties

Figure 18:
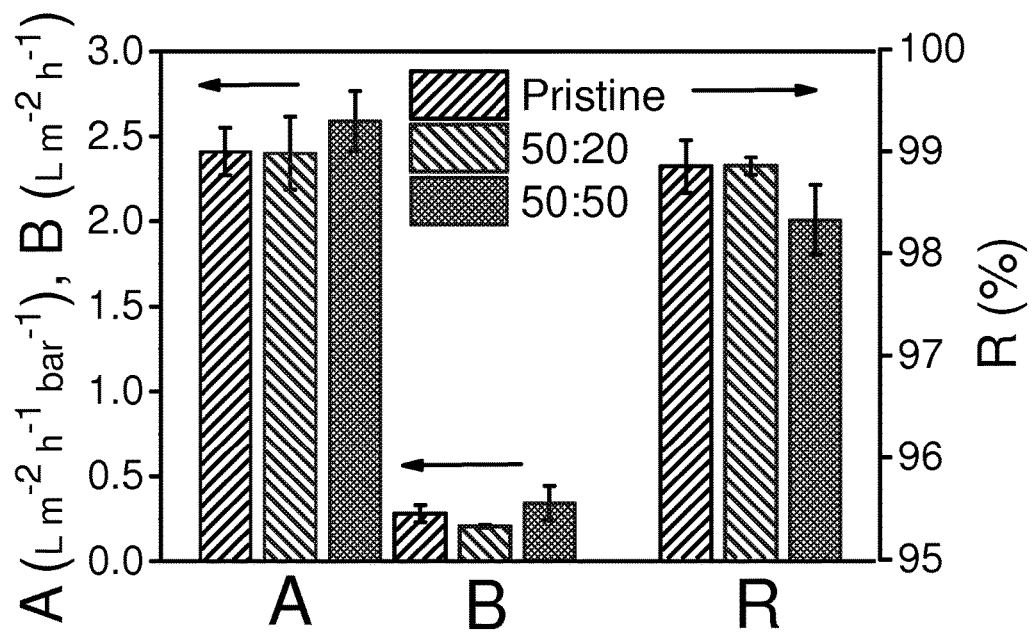
FIG. 18 illustrates water permeability coefficient, A, salt permeability coefficient, B, and R, salt rejection of pristine and in situ Cu-NP modified membranes prepared with different Cu:$BH_4$ solution concentrations (in mM; 50:20 is 50 mM Cu and 20 mM $BH_4$, etc.) (experimental conditions: pressure of 27.5 bar (400 psi), crossflow velocity of 21.4 cm/s, temperature of 25.0±0.5° C., and 50 mM NaCl).

The intrinsic transport properties of the membrane were inconspicuously changed during the Cu-NPs in situ formation procedure (FIG. 18). At relatively low NaHB$_4$ concentration of 20 mM and CuSO$_4$ concentration of 50 mM, the water permeability coefficient (A; L m$^{-1}$ h$^{-1}$ bar$^{-1}$), the salt permeability coefficient (B; L m$^{-2}$ h$^{-1}$), and the salt rejection (R; %) of Cu-NP in situ modified membrane were 2.40±0.21, 0.2±0.01, and 98.85±0.08 as compared to 2.41±0.41, 0.28±0.14, 98.85±0.26 for the pristine membrane, respectively. Increasing the NaHB$_4$ concentration to 50 mM while maintaining the CuSO$_4$ concentration (50 mM) during the in situ reduction, led to minute increase in water and salt permeability coefficients (A: 2.59±0.17 L m$^{-1}$ h$^{-1}$ bar$^{-1}$, B: 0.341±0.17 L m$^{-1}$ h$^{-1}$) and decrease in salt rejection (R: 98.325±0.34%). Thus, although NaBH$_4$ reported to be a selective reducer which is inert to the polyamide constituents (amide, carboxylic groups), at high concentration (such as 50 mM) the polyamide layer may be slightly damaged leading to its "opening" as indicated by the minimal increase of water and salt permeability coefficient.

Figure 19:
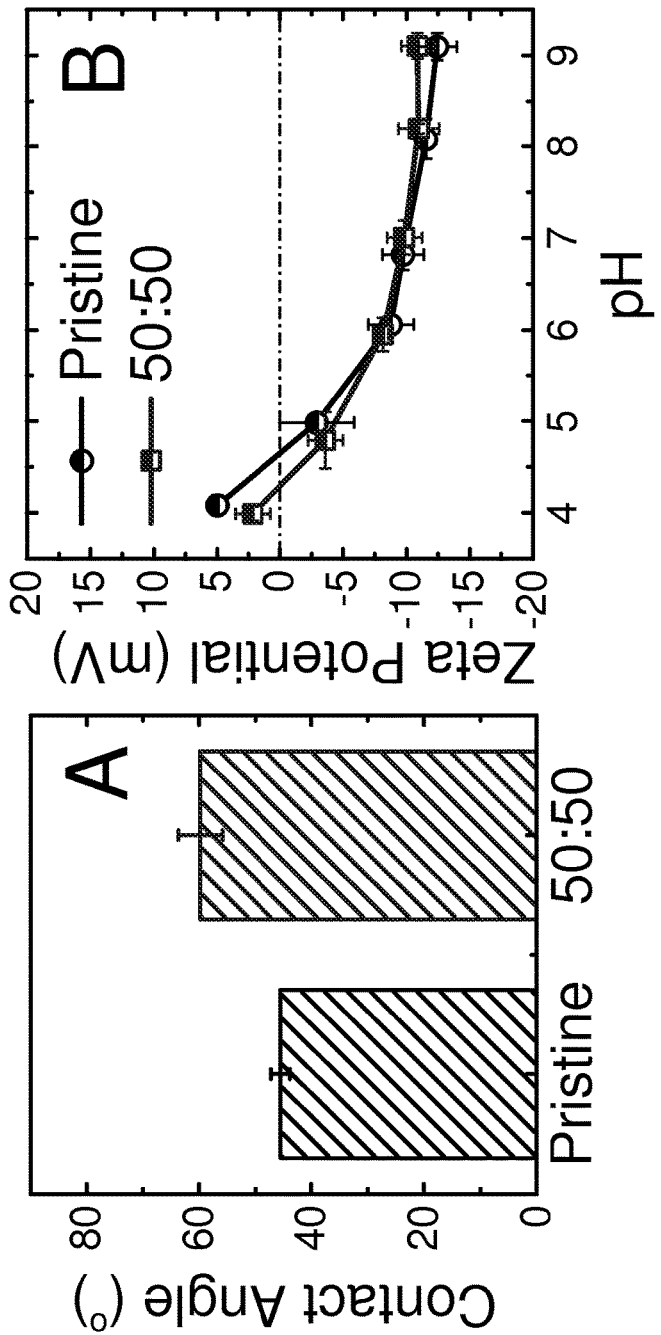
FIG. 19(A) illustrates membrane surface hydrophilicity represented by contact angle measurements.
FIG. 19(B) depicts membrane surface charge represented by zeta potential (notations 50:50 mean Ag:$BH_4$ concentrations (in mM) during the in situ Cu-NPs formation reaction).

The surface traits of the membrane were insignificantly impacted by the Cu-NPs in situ formation procedure. The surface hydrophilicity, represented by contact angle measurements, indicated small increase from 45.4±1.7° for the pristine membrane to 59.8±3.9° for the 50:50 modified membrane (FIG. 19A). The zeta potential of the in situ 50:50 copper modified membrane were similar to the pristine membrane in all the examined pH range (FIG. 19B). SEM micrographs (FIG. 16) revealed that the typical predominant roughness features of the polyamide layer surface were maintained after Cu-NPs in situ modification, implying minimal impact on the overall surface roughness of the membrane.

(c) Cu-NPs Dissolution Tendency

Figure 20:
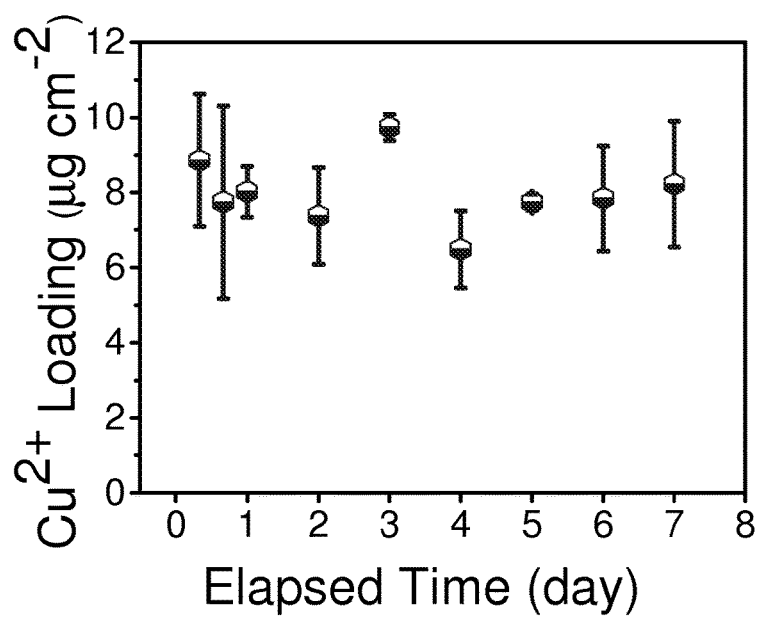
FIG. 20 illustrates residual copper loading on in situ Cu-NPs modified membrane (50:50) after dissolution for several days in 10 mL of 5 mM $NaHCO_3$ solution (pH 8.3).

In the essential simple solution examined here (DI water+5 mM NaHCO$_3$ as buffer, pH 8.3), a prominent dissolution of the in situ formed Cu-NPs to dissolved copper ions was not observed during 7 days of experiment (FIG. 20). The surface copper loadings on the membrane were maintained and undulated around values of 8 μg cm$^{-2}$ (as Cu$^{2+}$) during all the experimental days. The amount of dissolved Cu$^{2+}$ remained the same during the experiments with portion between 10-15% of the total copper that were initially in situ reduced on the membrane. It is emphasized that the solution chemistry highly affects the dissolution rates, and hence, in the presence of more intricate solution such as with salts, NOM, or extreme pH values, the dissolution rates of the in situ formed Cu-NPs will likely be accelerated. Also, increasing the crossflow shear above the membrane may lead to higher Cu dissolution rates than the one observed here.

(d) Antibacterial Activity of In Situ Modified Membrane

Figure 21:
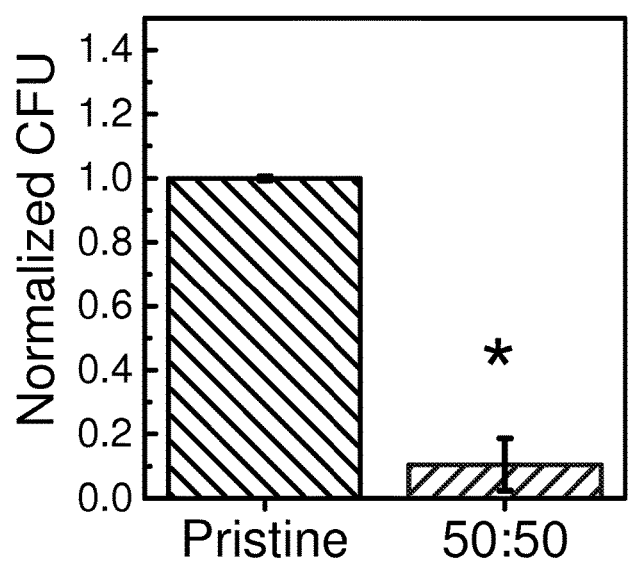
FIG. 21 illustrates the number of attached live bacteria colonies (CFU) on pristine (black) and in situ Cu-NPs modified membranes (Blue) for gram negative *E. coli* bacteria (experimental conditions: pristine and in situ modified (50:50 Cu:$BH_4$) membranes were contacted and incubated with isotonic solution (0.15M NaCl; 20 mM $NaHCO_3$ as buffer, pH 8.2) with bacteria ($OD_{600}$: 0.15±0.01) for 2 h at 37° C.; after incubation the membranes were sonicated with sterile isotonic solution and the detached bacteria were plated on LB agar).

The in situ formed Cu-NPs imparted strong antibacterial activity to the membrane surface leading to reduction of more than 90% in the number of live *E. coli* bacteria attached to the membrane after 2 h incubation, as compared to the pristine membrane (FIG. 21). This reduction may be explained either by toxicity effect or by weakened adhesion of bacteria to the modified membrane. The minute changes in the membrane surface properties (zeta potential, hydrophilicity, and roughness) during the in situ formation procedure, as discussed before, implies that the strong toxicity of Cu-NPs toward bacteria is likely the mechanistic explanation for the rendered antibacterial activity of the Cu-NPs in situ modified membrane.

(e) Conclusion

Copper, long known for its antibacterial activity and relatively low cost, is an attractive biocide with a proven history as a biofouling control agent in industrial applications. However, constraints on brine disposal quality and copper implementation costs require precise and efficient usage of copper for biofouling control in RO desalination. Localized loading of a copper source in the vicinity of the TFC-RO membrane surface, as demonstrated in the current study, can be an economically attractive method for localized protection of the membrane during the desalination process. The simplicity of the current Cu-NP synthesis, the facile membrane functionalization procedure, the insignificant impact on membrane transport properties, the ability to repeatedly recharge the Cu-NPs after depletion, and the imparted antibacterial activity, demonstrate the potential of the suggested methodology for biofouling in TFC-RO desalination processes.

The invention claimed is:

1. A method for in situ formation of biocidal metal nanoparticles on a reverse osmosis membrane, said method comprising:
   a) contacting a solution of a salt of a biocidal metal with an active layer of the membrane;
   b) discarding a portion of the biocidal metal salt solution such that a thin layer of the biocidal metal salt solution remains on the membrane surface;
   c) reacting a reducing agent solution with the active layer of the membrane and the thin layer of the biocidal metal salt solution thereby forming a biocidal metal nanoparticle-modified membrane;
   d) removing the reducing agent solution; and
   e) rinsing the biocidal metal nanoparticle-modified membrane.

2. The method according to claim 1, wherein the biocidal metal is at least one selected from the group consisting of copper, gold, silver, selenium and zinc.

3. The method according to claim 1, wherein the reducing agent is one or more selected from the group consisting of borohydrides, sulfites, phosphites, oxalic acid, formic acid, hydrazine and ascorbic acid.

4. The method according to claim 1, wherein the biocidal metal salt solution has a concentration of 0.1 to 100 mM.

5. The method according to claim 1, wherein the duration of the reacting of a) is in the range of from 0.5 minutes to 30 minutes.

6. The method according to claim 1, wherein the reducing agent solution has a concentration of 0.1 to 200 mM.

7. The method according to claim 1, wherein the duration of the reacting of c) is in the range of from 0.5 minutes to 60 minutes.

8. The method according to claim 1, wherein the rinsing of e) is performed with deionized water.

9. The method according to claim 1, wherein the duration of the rinsing of e) is in the range of from 1 second to 10 minutes.

10. The method according to claim 1, wherein each of a) through e) is performed at ambient conditions.

11. The method according to claim 1, wherein
the biocidal metal is silver,
the biocidal metal salt solution is $AgNO_3$, and
the biocidal metal nanoparticle-modified membrane has a silver loading with a linear relationship ($R^2$=0.99) to the concentration of the $AgNO_3$ solution, wherein the $AgNO_3$ solution has a concentration of 0.1 to 100 mM.

12. The method according to claim 1, wherein
the biocidal metal is silver, and
the water permeability of the silver nanoparticle-modified membrane is reduced by no more than 17% as compared to the unmodified membrane before performing a) through e).

13. The method according to claim 1, wherein the biocidal metal is silver, and the silver nanoparticle-modified membrane and the unmodified membrane before performing a) through e) have about the same salt rejection and salt permeability coefficient.

14. The method according to claim 1, wherein
the biocidal metal is copper, and
the biocidal metal salt solution is $CuSO_4$.

15. The method according to claim 1, wherein the biocidal metal is copper, and the copper nanoparticle-modified membrane and the unmodified membrane before performing a) through e) have about the same salt rejection and salt permeability coefficient.

* * * * *